(12) United States Patent
Tomar et al.

(10) Patent No.: US 10,218,343 B1
(45) Date of Patent: Feb. 26, 2019

(54) DUTY CYCLE CORRECTION SCHEME

(71) Applicant: SanDisk Technologies LLC, Plano, TX (US)

(72) Inventors: Bhawna Tomar, Karnataka (IN); Murali Krishna Balaga, Karnataka (IN); Ajay Kanth Chitturi, Karnataka (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/908,378

(22) Filed: Feb. 28, 2018

Related U.S. Application Data

(60) Provisional application No. 62/579,607, filed on Oct. 31, 2017.

(51) Int. Cl.
| H03K 5/04 | (2006.01) |
| H03K 5/156 | (2006.01) |
| G11C 7/22 | (2006.01) |
| H03K 5/13 | (2014.01) |
| H03K 5/00 | (2006.01) |

(52) U.S. Cl.
CPC .......... H03K 5/1565 (2013.01); G11C 7/222 (2013.01); H03K 5/13 (2013.01); H03K 2005/00286 (2013.01)

(58) Field of Classification Search
None
See application file for complete search history.

(56) References Cited

U.S. PATENT DOCUMENTS

| 9,178,521 B2 | 11/2015 | Giaconi et al. | |
| 9,413,339 B2 * | 8/2016 | Amirkhany | H03K 5/1565 |
| 2015/0171836 A1 * | 6/2015 | Lee | H03K 5/1565 |
| | | | 327/175 |
| 2018/0006636 A1 * | 1/2018 | Ma | H03K 5/1565 |

* cited by examiner

Primary Examiner — Long Nguyen
(74) Attorney, Agent, or Firm — Brinks Gilson & Lione

(57) ABSTRACT

A circuit may include control circuitry configured to determine a duty cycle error for a sample clock signal. Based on the duty cycle error the control circuitry may determine a corrective direction by which to alter the duty cycle to correct the duty cycle error. The control circuitry may indicate the corrective direction to selection circuitry via a selection signal. Responsive to the selection signal, the selection circuitry may select a leading phase signal and a lagging phase signal from among a plurality of relative phase signals. Output circuitry may combine the leading phase signal and a lagging phase signal to generate an output clock signal with a duty cycle corresponding the corrective direction.

20 Claims, 11 Drawing Sheets

US 10,218,343 B1

DUTY CYCLE CORRECTION SCHEME

PRIORITY

This application claims priority to U.S. Provisional Patent Application Ser. No. 62/579,607, filed 31 Oct. 2017, and titled DUTY CYCLE CORRECTION SCHEME, which is incorporated by reference in its entirety.

BACKGROUND

In memory applications, a storage device may include a controller that sends a clock signal, in some cases a pair of complementary signals, to a memory die in order to read data from the memory die. In response to the clock signal, the memory die may align data pulses of data signals to the edges of the clock signal and send the aligned data signals along with clocks signal back to the controller. The controller may then process the data signals using the clock signal.

Typically, the clocks signals have a 50% duty cycle. Theoretically, the controller generates the clock signals with the 50% duty cycle, and the duty cycle remains at 50% throughout the read process. That is, the memory die retrieving the data for the controller receives the clock signals with the 50% duty cycle, maintains the duty cycle at 50% while aligning the data, and transmits the clocks signals with a 50% duty cycle back to the controller.

However, in actual implementation, due to process-voltage-temperature (PVT) variations, the controller may not generate the clock signals with a 50% duty cycle and/or the duty cycle of clocks signals may shift away from the 50% duty cycle when the memory die aligns the data with the clock signals. Consequently, when the controller receives the data signals and the clock signals from the memory die, the controller may make errors in latching the data. For example, if the clock signals and the data signals are not properly aligned, the controller may miss sampling certain data pulses while sampling others twice. In addition or alternatively, if the duty cycle is sufficiently far from 50%, the controller's resistor-capacitor (RC) components may filter out or attenuate the edges of the clock signals. In turn, the controller may miss sampling certain data pulses because it failed to recognize a clock edge as occurring. In view of the errors that can result when the clock signals are generated away from 50% and/or when the duty cycle shifts away from 50% during data retrieval processes, duty cycle correction schemes that correct the duty cycle are desirable.

BRIEF DESCRIPTION OF THE DRAWINGS

Wherever convenient, the same reference numbers will be used throughout the drawings to refer to the same or like elements.

DETAILED DESCRIPTION

Figure 1:
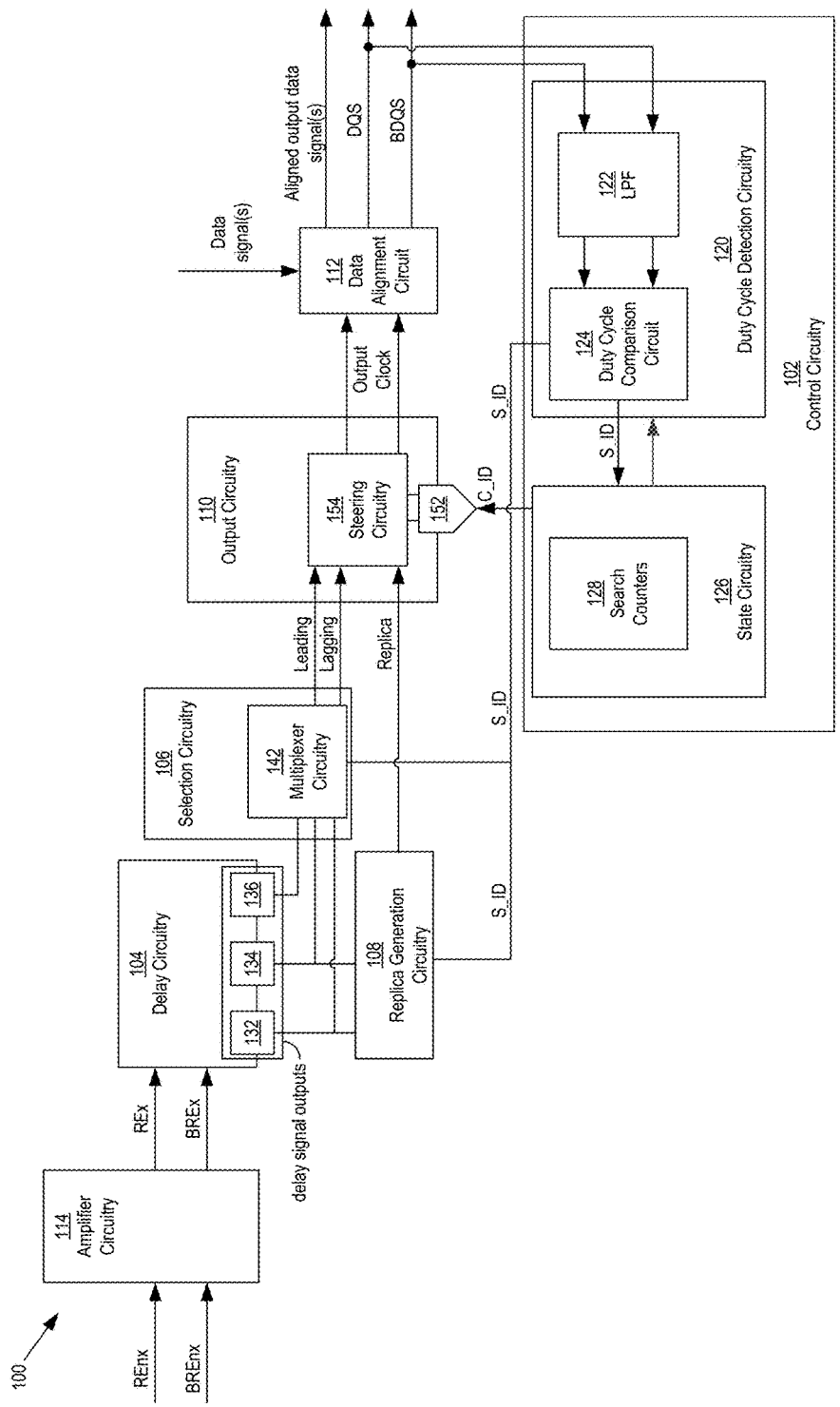
FIG. 1 is a block diagram of an example duty cycle correction circuit.

The present description describes techniques and architectures that include a duty cycle correction circuit configured to perform a duty cycle correction process. In one embodiment, a circuit includes: control circuitry configured to determine a corrective direction to change a duty cycle of a sample clock signal to correct for a duty cycle error of the sample clock signal; delay circuitry configured to delay an input clock signal to generate multiple or a plurality of delay signals including different phases relative to each other; selection circuitry configured to select a leading phase signal and a lagging phase signal from among the plurality of delay signals according to the corrective direction; and output circuitry configured to generate an output clock signal in response to a combination of the leading phase signal and the lagging phase signal, the output clock signal including a duty cycle corresponding to the corrective direction.

In some embodiments, the plurality of relative phase signals include: an early signal; a mid signal that is delayed with respect to the early signal; and a late signal that is delayed with respect to both the early and mid signals.

In some embodiments, the selection circuitry is configured to: select the early signal as the leading phase signal and the mid signal as the lagging phase signal when the corrective direction corresponds to reducing the duty cycle; and select the mid signal as the leading phase signal and the late signal as the lagging phase signal when the corrective direction corresponds to increasing the duty cycle.

In some embodiments, the delay circuitry includes a plurality of delay signal outputs are configured to generate the plurality of relative phase signals, the plurality of delay signal outputs separated from one another by a plurality of discrete delay stages.

In some embodiments, the discrete delay stages include inverter pairs that are individually configured to maintain polarity of the input clock signal after imparting delay.

In some embodiments, the selection circuitry includes: a digital-to-analog converter configured to receive selection code from the control circuitry and generate a control output; a leading multiplexer; and a lagging multiplexer. The leading multiplexer is configured to: receive the control output; and select the leading phase signal from among the multiple relative phase signals. The lagging multiplexer is configured to: receive the control output; and select the lagging phase signal from among the plurality of relative phase signals.

In some embodiments, the sample clock signal includes a complementary pair of clock signals; and the control circuitry is configured to determine which of the complementary pair of clock signals has a higher duty cycle.

In some embodiments, the control circuitry includes a low pass filter configured to: receive multiple or a plurality of cycles of the sample clock signal; generate a higher level voltage output responsive to the one of the complementary pair of clock signals with a higher duty cycle; and generate a lower level voltage output responsive to the one of the complementary pair of clock signals with a lower duty cycle.

In some embodiments, the output circuitry is configured to: fix rising transitions of the output clock signal to rising transitions of the leading phase signal; and interpolate between falling transitions of the leading and lagging phase signals to generate falling transitions of the output clock signal.

In another example, circuit includes: delay circuitry configured to, based on an input clock signal, generate a leading phase signal and a lagging phase signal; replica generation circuitry configured to, based on the input clock signal, generate a replica clock signal; and output circuitry. The output circuitry is configured to: select among a plurality of relative signal strengths for the leading phase signal and the lagging phase signal; and in response to the replica clock signal, drive combination of the leading phase signal and the lagging phase signal for rising transitions or for falling transitions of the input clock signal.

In some embodiments, the output circuitry includes a drive transistor configured to pull up a signal output of the output circuitry to a supply voltage level when the replica clock signal is at a low level.

In some embodiments, the output circuitry is configured to: steer current along a leading branch of the output circuitry in accord with the leading phase signal; and steer current along a lagging branch of the output circuitry in accord with the lagging phase signal.

In some embodiments, the leading branch includes a leading bias transistor configured to control a first relative signal strength of the plurality of relative signal strengths in accord with a leading bias voltage; and the lagging branch includes a lagging bias transistor configured to control a first relative signal strength of the plurality of relative signal strengths in accord with a lagging bias voltage.

In some embodiments, the output circuitry includes: a leading digital-to-analog converter and a lagging digital-to-analog converter. The leading digital-to-analog converter is configured to: receive a combination code from control circuitry; and responsive to the combination code generate the leading bias voltage. The lagging digital-to-analog converter is configured to: receive the combination code from control circuitry; and responsive to the combination code generate the lagging bias voltage.

In some embodiments, the leading bias transistor and the lagging bias transistor include n-channel metal oxide semiconductor transistors; and the output circuitry is configured to drive combination of the leading phase signal and the lagging phase signal for falling transitions of the input clock signal responsive to the replica clock signal.

In some embodiments, the leading branch includes a leading signal transistor configured to receive the leading phase signal; and the lagging branch includes a lagging signal transistor. The lagging signal transistor configured to: receive the lagging phase signal; and pull down a signal output of the output circuitry to a reference voltage level to generate a falling transition for an output clock signal in combination with the leading signal transistor.

In some embodiments, the replica generation circuitry includes a multiplexer configured to copy the leading phase signal to generate the replica clock signal.

In yet another example embodiment, a system includes: duty cycle detection circuitry, state circuitry, delay circuitry, replica generation circuitry, multiplexer circuitry, and output circuitry. The duty cycle detection circuitry is configured to: detect a duty cycle error for a sample clock signal; determine a corrective direction for a duty cycle of the sample clock signal based on the duty cycle error; and output a selection signal responsive to the corrective direction. The state circuitry is configured to: determine a current state of a search algorithm; and generate a combination signal based on the current state. The delay circuitry is configured to: generate a plurality of delay signals based on an input clock signal, the plurality of delay signals including different delays from each other relative to the input clock signal. The replica generation circuitry is configured to generate a replica clock signal based on a first one of the plurality of delay signals. The multiplexer circuitry is configured to output a pair of delay signals from among the plurality of delay signals responsive to the selection signal. The output circuitry includes a drive input configured to drive the output circuitry during a specific signal transition for each of a plurality of cycles of the first one of the plurality of delay signals responsive to the replica clock signal; and steering circuitry. The steering circuitry is configured to: receive the pair of delayed signals from the multiplexer circuitry; select a pair of relative signal strengths from among a plurality of predefined signal strengths for the pair of delayed signals responsive to the combination signal; steer current through a plurality of branches in accord with the pair of relative signal strengths responsive to the pair of delayed signals; and generate an output clock signal including a duty cycle corresponding to the corrective direction and steered current.

In some embodiments, the state circuitry is further configured to: access a state counter to determine a previous state determined during a previous search cycle of the search algorithm; determine the current state responsive to the corrective direction and the previous state; and update the state counter to reflect the current state.

Other implementations are possible, and each of the implementations can be used alone or together in combination. Accordingly, various implementations will now be described with reference to the attached drawings.

The following embodiments describe systems, apparatuses, devices, circuits, and related methods for correcting duty cycle distortion of a clock signal. To correct for duty cycle distortion, a system may change the portion of the time that a clock signal spends at a high voltage level. Specifically, the system may alter the timing of transitions, within the clock signal, from high voltage levels to low voltage levels and vice versa. These transitions define when the clock signal changes from the high voltage level to the low voltage level and vice versa. Accordingly, the timing of the transitions controls whether the clock signal spends more time at the high voltage level or the low voltage level.

One example technique for altering the timings is for a system to first fix the timing for low-to-high (rising) transitions of a clock signal. Then, the system combines high-to-low (falling) transition timings from two signals generated using a delay line. The two signals are referred to as the leading and lagging signals. The leading signal has a falling transition that occurs earlier than the falling transition of the lagging signal, in a given cycle of the signals. The combination of the leading and lagging signals may be based on a target duty cycle. In particular, the falling transition of the leading signal occurs earlier than the falling transition would if the clock signal had a target duty cycle. The falling transition of the lagging signal occurs later than the falling transition would if the clock signal had the target duty cycle.

By combining the leading phase signal and the lagging phase signal, the system creates an output signal, such as an output clock signal, with a characteristic based on a combination of characteristics of the leading and lagging phase signals. In particular example embodiments, the system generates the output signal to have a characteristic that is positioned in between the characteristics of the leading and lagging phase signals. The generation of the output signal to have a characteristic in between characteristics of the leading and lagging phase signals may be referred to as interpolation. Where the system interpolates the characteristic may depend on signal strengths of the leading and lagging phase signals, as described in further detail below.

In particular embodiments, the characteristic of the output signal that is between the characteristics of the input signals is a falling transition of the output that is between the rising transitions of the leading and lagging signals. When combining the leading and lagging phase signals to generate the output signal, the system may interpolate between the timings of the rising transitions of the leading and lagging phase signals to determine when the falling transitions of the output signal occur. In this context, the output signal that is generated may have falling transitions with timings that correspond to an interpolated phase-shift relative to phases associated with the rising transitions of the leading and lagging signals.

Further, the system may combine the leading and lagging phase signals and/or interpolate between the falling transitions of the leading and lagging phase signals based on relative signal strengths of the leading and lagging phase signals. In particular, the output signal has a falling transition timing that occurs closer in time to the rising transition of the stronger of the two signals. For example, if the lagging phase signal had no strength (e.g., no amplitude), the falling transition timing of the output would be the same as the rising transition of the leading phase signal. As the system increases the relative strength of the lagging phase signal, the falling transition timing of the output signal progresses closer and closer to the rising transition of the lagging phase signal. Because the system fixed the timing of the rising transition of the output signal, changing the timing of the falling transition changes the duty cycle of the clock signal.

In addition, the system may search different pairs of relative signal strengths for the leading and lagging phase signals to find a pair of relative signal strengths that produces an output signal with the target duty cycle. The system may search by selecting a first pair of relative signal strengths, producing an output signal based on the selection, and then by measuring the duty cycle. Then, if the measured duty cycle does not match the target duty cycle, the system may repeat the steps with a newly selected pair of relative strengths. These search cycles may repeat until the measured duty cycle matches the target duty cycle.

The above-mentioned technique may be implemented using example output circuitry. In brief, the example output circuitry includes a leading branch and a lagging branch connected in parallel to a signal output of the output circuitry. A leading signal transistor on the leading branch steers current through the leading branch in accord with a leading phase signal received at the gate of the leading signal transistor. Accordingly, the leading signal transistor allows current to flow through the leading branch with timings defined by the rising and falling transitions of the leading phase signal. A lagging signal transistor on the lagging branch steers current through the lagging branch in accord with a lagging phase signal received at the gate of the lagging signal transistor. Accordingly, the lagging signal transistor allows current to flow through the lagging branch with timings defined by the rising and falling transitions of the lagging phase signal.

Further, the leading and lagging braches include leading and lagging bias transistors, respectively. The leading and lagging bias transistors control the current amplitude through their respective branches. Accordingly, the leading and lagging branches control the relative current amplitudes (signal strengths) within the leading and lagging branches. Therefore, at the signal output of the output circuitry the current steered through the leading and lagging branches combines to control the transition timings at the signal output.

The example output circuitry may also include driving circuitry that fixes the timing of rising transitions at the signal output of the output circuitry. Accordingly, the current steered through the leading and lagging branches affects the timing of the falling transitions at the signal output but not the rising transitions. Accordingly, the output circuitry may perform the above-discussed technique to adjust a duty cycle by combining the timings of the leading and lagging phase signals for the falling transition using the branches and fixing the timing of the rising transition using the driving circuitry.

The output circuitry is discussed in more detail below with reference to FIG. 3. In addition, as discussed in detail below, the system may further include: delay circuitry and selection circuitry to generate and select the leading and lagging phase signals; replica circuitry to generate a replica signal to drive the driving circuitry; and control circuitry to perform the search through the pairs of relative signals strengths. Moreover, the discussion below includes more detail on, transitions, relative signal strengths, combination, driving, steering, relative phases, and other terms used herein.

As used herein, two signals of a pair are complementary in that when one of the signals is at an associated high level the other is at an associated low level. The waveforms of two complementary signals are considered to inversely track each other in that when one signals performs a rising transition, the other signal performs a falling transition. In addition or alternatively, two signals that are complementary are 180-degrees out of phase with each other or have waveforms representative of two signals that are 180-degrees out of phase with each other. Differential signals are a type of complementary signals.

Also, as used herein, a level of a signal at a given point in time is a magnitude value, such as a voltage magnitude value or a current magnitude value. In general, a high level and a low level are both magnitude values where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

In addition or alternatively, a given signal may transition between a high level and a low level according to a swing requirement that sets or identifies a minimum high level and a maximum low level. A signal that transitions according to the swing requirement may transition to a high level that is at or above the minimum high level of the swing requirement, and may transition to a low level that is at or below the maximum low level of the swing requirement.

In addition or alternatively, for a given voltage that is applied to a gate terminal of a p-channel metal-oxide-semiconductor field-effect transistor (PMOS transistor), the high level of the given voltage is a level that turns off or is capable of turning off the PMOS transistor, and the low level of the given voltage is a level that turns on or is capable of turning on the PMOS transistor. Similarly, for a given voltage that is applied to a gate terminal of an n-channel metal-oxide-semiconductor field-effect transistor (NMOS transistor), the high level of the given voltage is a level that turns on or is capable of turning on the NMOS transistor, and the low level of the given voltage is a level that turns off or is capable of turning off the NMOS transistor.

As used herein, a transition refers to a change within a signal from one level to another. For example, a signal may perform a rising transition when the signal transitions from its low level to its high level, and may perform a falling transition when the signal transitions from its high level to its low level. For a pair of complementary signals, when a first signal of the pair is performing a rising transition, a second signal of the pair is performing a falling transition, or in the event that the rising and falling transitions are not occurring concurrently, then the transition of the second signal that is occurring closest in time to the rising transition of the first signal is a falling transition. Similarly, when the first signal of the pair is performing a falling transition, the second signal is performing a rising transition, or in the event that the rising and falling transitions are not occurring concurrently, then the transition of the second signal that is occurring closest in time to the falling transition of the first signal is a rising transition. A rising edge of a signal's waveform denotes a rising transition, and a falling edge of a signal's waveform denotes a falling transition.

In addition, each signal may include pulses that are formed or defined by the rising and falling transitions of the signal. In particular example configurations, the pulses of a signal may correspond to the high level of a signal, in that each pulse is defined by a rising transition followed by a period where the signal is maintained at its high level, and then followed by a falling transition.

Additionally, a pair of complementary signals may perform their respective rising and falling transitions according to an associated frequency or rate. The pulses of the signals may occur according to the frequency of the signal. Each period or cycle of the signals may include a first portion and a second portion. During the first portion, a first signal of the pair is at the high level and a second signal of the pair is at the low level. During the second portion, the first signal is at the low level and the second signal is at the high level. In addition, each signal of the pair may have an associated duty cycle. As used herein, a duty cycle of a signal is the percentage or fraction of one period that the signal is at its high level. In addition or alternatively, the duty cycle of a signal is the ratio of a pulse width of a pulse in a single period of the signal to a total duration of the period.

Also, in at least some example configurations, a pair of complementary signals is a pair of clock signals. A clock signal has repetitive cycles. Within each period, the first portion occurs first in time and the second portion occurs second in time—e.g., after the first portion. After the last portion of one cycle occurs, the first portion of a next cycle occurs. In at least some clock signals the second and last portions may be the same. For clock signals, the rising and falling edges of the signals may be used for timing purposes, such as for temporarily aligning data pulses of data signals and/or for indicating when to sample or otherwise identify levels of the data pulses, as described in further detail below.

FIG. 1 is a block diagram of an example duty cycle correction circuit system 100 that is configured to correct duty cycle distortion in an output clock signal. The duty cycle correction circuit 100 may include control circuitry 102, delay circuitry 104, selection circuitry 106, replica generation circuitry 108, and output circuitry 110. The duty cycle correction circuit 100 may further include, or alternatively be in communication with, a data alignment circuit 112. The data alignment circuit 112 may be configured to receive one or more data signals and output one or more aligned output data signals that correspond to the one or more data signals it receives. A data signal may include a series of data pulses, with each data pulse corresponding to a bit of a bit sequence. The level, such as a voltage level, of each data pulse, may correspond to and/or indicate a single bit logic value, such as a logic 1 value or a logic 0 value. Accordingly, each data pulse of the data signal may indicate whether a corresponding bit of the bit sequence represented by the data signal has a logic 1 value or a logic 0 value. Other configurations, such as those where the levels of the data pulses indicate multi-bit logic values, may be possible.

The delay circuit 104 may be configured to receive an input clock signal. In some implementations, the input clock signal may include a pair of complementary signals REnx, BREnx. However, in some implementations, the input clock signal may include intermediate complementary signals including a pair of complementary intermediate signals REx, BREx generated at amplifier circuitry 114 responsive to the REnx and BREnx signals. The data alignment circuit 112 may be configured to receive the second pair of complementary intermediate signals REx, BREx, and in response, generate and output a pair of complementary output signals DQS, BDQS. In this context, the amplifier circuit 114 and the data alignment circuit 112 may form a signal path circuit extending from the input of the amplifier circuit 114 to the output of the data alignment circuit 112. As a whole, the complementary signal path circuit is configured to receive the pair of complementary signals REnx, BREnx, and generate the pair of complementary output signals DQS, BDQS in response to receipt of the pair of complementary signals REnx, BREnx. In the complementary signal path, the amplifier circuit 114 generates the pair of intermediate signals REx and BREx, and the data alignment circuit 112 aligns the data signal(s) with the pair of intermediate signals REx, BREx, and outputs the output signals DQS, BDQS in response to the alignment process. The pair of complementary intermediate signals REx, BREx may be referred to as the amplifier output signals of the amplifier circuit 114. In various implementations, paths other than the example complementary signal path may be used. For example, some input clock signals may not necessarily include complementary signal inputs. Rather, the techniques and architectures described below may either generate the complement of an input clock signal or implement duty cycle detection schemes independent complementary signals, as discussed below.

The data alignment circuit 112 may be configured to generate and output the pair of complementary output signals DQS, BDQS each with a respective target or predetermined duty cycle or a duty cycle that is within an acceptable range of duty cycles. The acceptable range may include and/or be centered around the predetermined duty cycle. For example, the acceptable range may be a set of duty cycles defined by the predetermined duty cycle plus-or-minus a predetermined error amount or plus-or-minus a certain percentage of the predetermined duty cycle. A duty cycle that is away from the predetermined duty cycle and/or outside of the acceptable range of duty cycles is referred to as a distorted duty cycle. Conversely, a duty cycle that is at the predetermined duty cycle or within the acceptable range of duty cycles is referred to as an undistorted duty cycle. For a given signal, an amount of duty cycle distortion of the signal is a difference between an actual duty cycle of the signal and the predetermined duty cycle. In some embodiments, a system may be referred to according to the system's target duty cycle. For example, a system with a 50% target duty cycle may be referred to as a 50% duty cycle system.

Additionally, two complementary signals of a pair may have an amount of duty cycle mismatch, which is the difference between a duty cycle of one signal and the duty cycle of the other. A pair of complementary signals may have a target or predetermined amount of duty cycle mismatch. Where the duty cycles of the two complementary signals are the same, then the amount of duty cycle mismatch is zero. Similarly, where the predetermined duty cycles of the two complementary signals are the same, then the amount of predetermined duty cycle mismatch is zero. Two complementary signals of a pair have undistorted duty cycles when their duty cycle mismatch is at the predetermined amount of duty cycle mismatch, or within an acceptable range of duty cycle mismatch values. The acceptable range may be centered around the predetermined amount of duty cycle mismatch. For example, the acceptable range may be a set of duty cycles mismatch values defined by the predetermined duty cycle mismatch amount plus-or-minus a predetermined error amount or plus-or-minus a certain percentage of the predetermined duty cycle mismatch amount. A pair of complementary signals has undistorted duty cycles when their duty cycle mismatch is at the predetermined duty cycle mismatch amount or within the acceptable range of duty cycle mismatch. Alternatively, a pair of complementary signals has distorted duty cycles when their duty cycle mismatch deviates from the predetermined duty cycle mismatch amount or outside of the range of acceptable duty cycle mismatch values. For a given pair of complementary signals, an amount of duty cycle distortion is a difference between an actual duty cycle mismatch of the complementary signals and the predetermined duty cycle mismatch amount.

An amount of duty cycle mismatch may be an instantaneous value that indicates a difference of the instantaneous duty cycle of one signal and the instantaneous duty cycle of another signal for a single period or cycle of the signals. Alternatively, the duty cycle mismatch may be an average value that indicates a difference of an average duty cycle of one signal and the average duty cycle of another signal for a predetermined number of cycles or periods and/or over a plurality of periods or cycles occurring over a predetermined period of time.

Similarly, an amount of duty cycle distortion for a single signal may be an instantaneous value that indicates a difference of the instantaneous duty cycle of the signal for single period or cycle and the predetermined duty cycle of the signal. Alternatively, the amount of duty cycle distortion for a single signal may be an average value that indicates a difference of the average duty cycle of the signal for a predetermined number of cycles or periods and/or over a plurality of periods or cycles occurring over a predetermined period of time. Likewise, the amount of duty cycle distortion for a pair of complementary signals may be an instantaneous value that indicates a difference of an instantaneous amount of duty cycle mismatch between the two signals and a predetermined duty cycle mismatch amount, or an average value that indicates a difference of an average amount of duty cycle mismatch between the two signals for a predetermined number of cycles or a plurality of periods or cycles occurring over a predetermined period and the predetermined duty cycle mismatch amount.

Duty cycle distortion may be detected by circuitry as a duty cycle error. As used herein, a duty cycle error refers to any duty cycle distortion detected by circuitry. When duty cycle distortion is non-existent or below a minimum detection level, circuitry may not detect duty cycle distortion and the duty cycle error may fall to zero. Duty cycle error may be proportionate to the level of duty cycle distortion. For example, duty cycle error may increase linearly or logarithmically with duty cycle distortion. However, in some embodiments, duty cycle error may be binary, indicative of the presence or non-presence of duty cycle distortion. Further, whether proportionate or not, duty cycle error may, in some embodiments, indicate the direction of the duty cycle distortion. For example, the duty cycle error may indicate that a clock signal has a duty cycle that is lower than a target duty cycle.

Depending on where the control circuitry 102 is configured to capture samples within the system, the control circuitry 102 may detect duty cycle distortion in one or more of the pairs of complementary signals REnx and BREnx, REx and BREx, and DQS and BDQS. Responsive to detected duty cycle distortion, the duty cycle correction circuit 100 may be configured to perform a correction process that adjusts or modifies one or more characteristics of the pair of complementary intermediate signals REx, BREx so that the pair of output signals DQS, BDQS are output with undistorted duty cycles. As described in further detail below, non-limiting example characteristics of the intermediate signals that are adjusted or modified may include gain, high voltage level, low voltage level, common mode voltage, cross-point, or duty cycle. In some example configurations, the predetermined duty cycle is 50%, although other predetermined duty cycle percentages may be possible.

As shown in FIG. 1, the data alignment circuit 112 may be configured to receive the second pair of complementary intermediate signals REx, BREx from the amplifier circuit 114. The data alignment circuit 112 may be configured to perform an alignment process with the second pair of complementary intermediate signals REx, BREx and the data signal(s) it receives such that the output data signal(s) are aligned with the pair of complementary output signals DQS, BDQS. By being aligned, the data pulses of the output data signal(s), such as the rising and falling transitions of the data pulses, occur at certain times relative to the rising and falling transitions or edges of the pair of complementary output signals DQS, BDQS. In some example configurations, the output data signal(s) may be aligned with the pair of complementary output signals DQS, BDQS in that their rising and falling transitions occur at the same time or about the same time that the complementary output signals DQS, BDQS perform their respective rising and falling transitions. In other example configurations, the output data signal(s) may be aligned with the pair of complementary output signals DQS, BDQS in that their rising and falling transitions occur at a certain, predetermined offset relative to the times that the pair of complementary output signals DQS, BDQS perform their respective rising and falling transitions. For example, the rising and falling transitions of the data signal(s) may occur at midpoints between consecutive rising and falling transitions of the pair of complementary output signals DQS, BDQS. In other words, the data signal(s) may be delayed or phase shifted 90-degrees relative to the pulses of the pair of complementary output signals DQS, BDQS. In addition or alternatively, the data signals and the complementary output signals DQS, BDQS may be aligned in accordance with a signaling or communication scheme, such as a single data rate (SDR) or a double data rate (DDR) communication scheme. The data alignment circuit 112 may include any of various types of circuits to perform the alignment process, including logic circuitry, combinational logic circuitry, flip-flops, and multiplexers, and non-limiting examples.

The control circuitry 102, e.g., via duty cycle detection circuitry 120, detects the presence of the duty cycle distortion or duty cycle error in a sample clock signal and, based on the detection, determines a corrective direction with which to correct, change, or mitigate the duty cycle distortion or correct for the duty cycle error of the sample clock signal. As used herein, a corrective direction refers to the direction in which a change to the duty cycle would work to undo, minimize, or reduce the distortion. For example, if the duty cycle is higher than a target duty cycle, a change expected to reduce the duty cycle would align with the corrective direction. If the duty cycle is lower than a target duty cycle, a change expected to increase the duty cycle would align with the corrective direction.

The control circuitry 102 may be a feedback circuit that forms a feedback path for the output circuitry 108 by determining a corrective direction for a sample clock signal. For some example configurations, such as shown in FIG. 1, the control circuitry 102 may be coupled to the output of the data alignment circuit 112 and be configured to receive the complementary output signals DQS, BDQS as the sample clock signal. For other example configurations, although not shown in FIG. 1, the control circuitry 102 may be coupled to the input of the amplifier circuitry 114 and receive complementary signals REnx and BREnx as the sample clock signal. Further, the control circuitry 102 may be coupled to the output of the amplifier circuitry and receive the pair of complementary intermediate signals REx and BREx as the sample clock signal. In still other example configurations, the sample clock signal may also include a single one of a pair of complementary signals such as DQS without BDQS or vice versa. For clarity, hereafter, the pair of complementary output signals DQS, BDQS is referred to as the sample clock signal in accordance with the example configuration shown in FIG. 1.

In response to receipt of the sample clock signal, the control circuitry 102 may be configured to perform a duty cycle correction process, which includes determining a corrective direction based on the duty cycle distortion. Based on the corrective direction, the control circuitry 102 generates at least one selection signal S_ID that controls selection of delay signals at the selection circuitry 106.

The control circuitry 102 may include a duty cycle detection circuitry 120 that is configured to receive the sample clock signal, detect a duty cycle error, based on the duty cycle error determine a corrective direction for the sample clock signal, and output selection signals, such as signals at certain, predetermined voltage levels, digital selection codes, or other signals that indicate the corrective direction. For example, a first level of a selection signal S_ID may indicate that the corrective direction corresponds to reducing the duty cycle, and a second level of the selection signal S_ID may indicate that the corrective direction corresponding to increasing the duty cycle for the sample clock signal.

For some example configurations, the duty cycle detection circuitry 120 may include averaging circuitry that is configured to average the duty cycles of sample clock signal. The averaging circuitry may include low pass filters (LPF), such as resistor-capacitor (RC) filters, that filter out high frequency or alternating current (AC) components of the sample clock signal. The output of the low pass filters is a pair of direct current (DC) voltage levels that indicate averaged duty cycles of the sample clock signal. FIG. 1 shows the duty cycle detection circuitry 120 as including a first low pass filter (LPF) 122 configured to receive the sample clock signal and generate the selection signal S_ID.

For some implementations in which the sample clock signal includes complementary signals, the duty cycle detection circuitry 120 may further include a duty cycle comparison circuit 124 that is configured to determine a duty cycle error by comparing the outputs of the LPF 122 to determine which of the pair of complementary signals has a higher duty cycle. For example, the outputs of the LPF 122 may produce increasing voltage level output responsive to increasing duty cycle. Accordingly, the signal of the pair with the higher duty cycle may produce a higher voltage level at its corresponding output of the LPF 122. Based on the comparison, the duty cycle comparison circuit 124 may determine which of the duty cycles is higher and which is lower. Responsive to the determination, the duty cycle comparison circuit 124 may generate a duty cycle error.

In some implementations, the control circuitry 102 may further determine the corrective direction from the duty cycle error. For example, for 50% duty cycle systems, when a given signal's duty cycle is higher than its complement signal, the signal's duty cycle is higher than 50% and may be corrected by reducing the duty cycle. However, other duty cycle comparison schemes and other duty cycle targets may be implemented. Accordingly, the control circuitry 102 may generate the selection signal S_ID at a level corresponding to selection of delay signals that tends to reduce the duty cycle of the signal. On the other hand, where the signal's duty cycle is lower than its complement signal, the signal's duty cycle is lower than 50% and may be corrected by increasing the duty cycle. Accordingly, the control circuitry 102 may generate the selection signal S_ID at a level corresponding to selection of delay signals that tends to increase the duty cycle of the signal. The level of the selection signal S_ID may indicate the corrective direction. The control circuitry 102 may provide the selection signal S_ID to the selection circuitry 106.

The control circuitry 102 may further include state circuitry 126. The state circuitry 126 may accept or receive the selection signal S_ID as an input. In addition, the state circuitry 126 may execute a search algorithm in response to the selection signal S_ID, and output a combination signal C_ID in response to execution of the search algorithm. Further description of the combination signal C_ID is described in further detail below. In some implementations, the state circuitry 126 may include a finite state machine (FSM) to execute the search algorithm. In addition, the state circuitry 126 may further include search counters 128. The state circuitry 126 may, as described below, use the search counters 128 to support execution of the search algorithm.

The delay circuitry 104 may be configured to generate a plurality or multiple delay signals in response to receipt of an input clock signal. In general, a delay signal refers to a signal that has an associated delay relative to a reference signal. The delay signal may be referred to as a delay signal of the reference signal. The delay signal performs transitions (including rising transitions and falling transitions) that correspond to transitions of the reference signal. As the delay signal propagates, the delay signal performs transitions at times relative to times that the reference signal performs corresponding transitions. The associated delay, such as the amount of delay, of the delay signal is defined by the amount of time that has elapsed from the time that the reference signal performs a transition to when the delay signal performs its corresponding transition.

Multiple, or a plurality of, delay signals may each have an associated delay relative to the reference signal. Delay signals that each have an associated delay relative to the reference signal may be referred to as relative delay signals and have an associated delay relative to the reference signal and to each other. Also, any two delay signals of the multiple delay signals may have the same amount of delay as each other or have different delays from each other. Additionally, for two delay signals, including a first delay signal and a second delay signal, that perform respective transitions that both correspond to transitions of the reference signal, a given transition of the first delay signal and a given transition of the second delay signal that both correspond to the same transition of the reference signal may be referred to as corresponding to each other. Also, each delay signal may perform its respective transitions within associated cycles. For two delay signals, including a first delay signal and a second delay signal, a given cycle of the first delay signal and a given cycle of the second delay signal may correspond to each other where the transitions within the respective given cycles correspond to each other.

Further, for two delay signals with different delays, one of the delay signals is a leading delay signal and the other signal is a lagging delay signal. In particular, the delay signal that performs its corresponding transitions at times earlier than the times that the other delay signal performs its corresponding transitions is the leading delay signal. The delay signal that performs its corresponding transitions at times later than the times that the other delay signal performs its corresponding transitions is the lagging delay signal.

In addition, a delay signal may be additionally, or alternatively, referred to as a phase signal. In general, a phase signal is a signal that has an associated phase relative to the reference signal. The phase is determined, or defined, by when the phase signal performs its transitions relative to when the reference signal performs its corresponding transitions. For example, a phase signal that performs a transition at a time exactly in between the time that the reference signal performs its corresponding transition and the time the reference signal performs its immediately subsequent transition has an associated phase of 90 degrees.

Additionally, an amount of delay and an amount phase that a given delay signal has may correspond to each other. In this context, the delay of a given delay signal may be referred to as a phase delay. In general, the larger the delay that a signal has, the larger its phase lag, and vice versa.

Additionally, multiple, or a plurality of, phase signals may each have an associated delay relative to the reference signal. Phase signals that each have an associated delay relative to the reference signal may be referred to as relative phase signals and have an associated delay relative to the reference signal, and to each other. For two signals with different delays and corresponding different phases, the leading delay signal may additionally, or alternatively, be referred to as a leading phase signal or a leading phase delay signal. Otherwise stated, for two signals with different delays and different corresponding phases, the signal that has a smaller delay, or smaller phase, is the leading phase signal and the signal that has the larger delay or larger phase is the lagging phase signal.

Also, a delay signal that is generated by being delayed may be referred to as being shifted, such as being shifted later in time. In this context, a phase of a signal may additionally or alternatively be referred to as its phase shift. Also, a circuit component that delays a first signal to generate a second signal may have an associated amount of delay and/or an associated amount of phase by which to delay the first signal. The second signal may be referred to as a delayed version or a phase-shifted version of the first. Herein, delay signals and phase signals are referred to interchangeably. For example, for a given pair of two delay signals, one of the delay signals may be a leading phase signal of the pair and the other delay signal may be a lagging phase signal of the pair.

Referring to FIG. 1, the reference signal to which delays signals generated by the delay circuitry 104 have their associated delays, phases, and/or phase shifts is an input clock signal that is input to the delay circuitry 104. For some example configurations, such as the one shown in FIG. 1, the input clock signal may be the pair of signals REx, BREx received from the amplifier circuitry 114. For these example configurations, the input clock signal and the sample clock signal are different signals. For example, the sample clock signal may include the pair of output signals DQS, BDQS, while the input clock signal may include the signals REx, BREx received from the amplifier circuitry 114. Accordingly, the delay circuitry 104 receives the input clock signal at a location different than the location where the control circuitry 102 obtains the sample clock signal. For other example configurations, the input clock signal that the delay circuitry 104 receives and the sample clock signal that the control circuitry 102 receives are the same—i.e., both the input clock signal as REx, BREx and the sample clock signal includes the pair of output signals DQS, BDQS.

The delay circuitry 104 may include a delay line with multiple delay signal outputs 132, 134, 136 corresponding to different delays or phases. The delay circuitry 104 may delay the input clock signal to produce or generate multiple or a plurality of delay or phase signals with different delays, phases, phase delays, or phase-shifts with respect to one another. Each of the outputs 132, 134, 136 may be configured to output a respective one of the delay signals with a delay or phase relative to the other delay signals and to the input clock signal that corresponds to its delay or phase. For example, the delay circuitry 104 may produce an early delay signal at an early output 132, a mid delay signal at a mid output 134, and a late delay signal at a late output 136. The early output 132 may have the shortest delay or smallest phase of the outputs 132, 134, 136, and so the early delay signal that the early output 132 outputs has the shortest delay or smallest phase among the delay signals. The late output 136 may have the longest delay or largest phase of the outputs 132, 134, 136, and so the late delay signal that the late output 136 outputs has the longest delay or the largest phase among the delay signals. The mid output 134 may have a middle delay/phase in between the shortest delay/smallest phase of the early output 132 and the longest delay/latest phase of the late output 136, and so the mid delay signal that the mid output 134 outputs has a mid delay or phase among the delay signals.

Accordingly, among the early signal and the mid signal output from the early and mid outputs 132, 134 respectively, the early signal is the leading delay or leading phase signal, and the mid signal is the lagging delay or lagging phase signal. Similarly, among the mid signal and the late signal output from the mid and late outputs 134, 136 respectively, the mid signal is the leading delay or leading phase signal, and the late signal is the lagging delay or lagging phase signal. Also, among the early signal and the late signal output from the early and late outputs 132, 136, respectively, the early signal is the leading delay or leading phase signal, and the late signal is the lagging delay or lagging phase signal.

The outputs 132, 134, 136 may be coupled to the selection circuitry 106 and the replica generation circuitry 108. The selection circuitry 106 may select one or more delay signals from among the plurality of delay signals received from the delay signal outputs 132, 134, 136 for output to the output circuitry 110. In particular example configurations, the selection circuitry 106 is configured to select a pair of delay signals from among the plurality of delay signals, where one of the signals of the pair is a leading phase signal and the other signal of the pair is a lagging signal. In particular example embodiments, the selection circuitry 104 may select the leading and lagging phase signals according to or based on the corrective direction for the sample clock signal as indicated by the selection signal S_ID. For example, in response to the selection signal S_ID indicating that the duty cycle of the sample clock signal should be reduced, the early and mid delay signals may be selected as the leading and lagging phase signals, respectively. Conversely, for a corrective direction indicating that the duty cycle of the sample clock signal should be increased, the selection circuitry 104 may select the mid and late delay signals as the leading and lagging phase signals, respectively.

The selection circuitry 106 may include multiplexer circuitry 142 that may accept multiple or a plurality of delay signals as input and select one or more delay signals from among the plurality of received delay signals responsive to the selection signal S_ID. In particular example configurations, the multiplexer circuitry 142 may select a pair of delay signals, including a leading phase signal and a lagging phase signal, from among the plurality of received delay signals. In some implementations, the multiplexer circuitry 142 may include a leading multiplexer that selects a leading phase signal and a lagging multiplexer that selects a lagging phase signal, as described in further detail below with respect to FIG. 2.

The replica generation circuitry 108 may generate a replica signal from the one or more delay signals, to act as a drive signal for the output circuitry 110 as described below. In some embodiments, the replica generation circuitry 108 may generate the replica signal based on a selected delay signal. For example, the replica generation circuitry 108 may be configured to match the operation of the leading multiplexer. Thus, the replica signal may have the same transition timings as the leading phase signal. The replica signal and the delay signals may all be generated based on the input signal.

The output circuitry 110 may be configured to generate an output clock signal in response to the leading phase signal and the lagging phase signal. In particular, the output circuitry 110 may be configured to generate the output clock signal based on a combination of the leading phase signal and the lagging phase signal. A duty cycle of the output clock signal may correspond to the corrective direction indicated by the selection signal S_ID. In addition or alternatively, the duty cycle of the output signal is a corrected duty cycle in that it is closer to the target duty cycle compared to the duty cycle of the input clock signal received by the delay circuitry 104.

The output circuitry 110 may be configured to generate the output clock signal by combining the selected delay signals. In general, a circuit combines two or more input signals by combining features or characteristics of those input signals. The output signal that the circuit generates has at least one feature or characteristic at a level or value that is based on the combination of the input signals, such as a combination of one or more features of characteristics of the input signals. Non-limiting example characteristics or features of a signal include rising transitions, falling transition, peaks, plateaus, currents, voltages, magnitudes, frequencies, phases, pulse widths, or duty cycles.

For some embodiments, the characteristics of the input signals that are combined and the characteristic of the output signal that is based on the combination are the same. As an example, the output signal may perform falling transitions at times based on a combination of the rising transitions of the input signals. For other embodiments, the characteristics of the input signal that are combined and the characteristic of the output signal that is based on the combination are different. As an example, the output signal may have a duty cycle based on a combination of the phases of the input signals.

With respect to the output circuitry 110, in some embodiments as described below, the output circuitry 110 may be configured to generate the output clock signal having a characteristic that is based on a combination of characteristics of the selected delay signals. In particular embodiments, the output circuitry 110 may generate the output clock signal with falling transitions that occur at times (referred to as falling transition times or timings) based on a combination of the phases of the selected delay signals. The falling transition timings of the output clock signal, may in turn, determine the duty cycle of the output clock signal.

Additionally, in some embodiments, the output circuitry 110 may be configured to combine the selected delay signals by drawing current generated from the selected delay signals. In particular, the output circuitry 110 may include a steering circuit 154 that includes a plurality of current branches. Each branch may receive a respective one of the selected delay signals, and draw a respective current based on the selected delay signal it receives. For a given branch, the current that the given branch draws may be based on a feature or characteristic of the selected delay signal it receives. For example, the current may be based on a phase of the selected delay signal. The steering circuitry 154, including its branches, may be coupled to a signal output where the output circuitry 110 generates the output clock signal. A combination of the currents drawn through the branches may determine, at least in part, the voltage level of the voltage generated on the signal output, which in turn determines one or more characteristics of the output clock signal, such as the rising or falling transition times of the output clock signal and/or the duty cycle of the output clock signal. In this way, since one or more characteristics of the output clock signal depend on the voltage generated at the signal output, the voltage generated at the signal output depends on the currents in the current branches, and the currents in the current branches depend on the characteristics of the selected delay signals, then the output circuitry 110, through use of the steering circuitry 154, may generate the output clock signal with at least one characteristic that is based on a combination of characteristics of the selected delay signals.

Use of current branches to draw current in response to receipt of the selected delay signals is just one way that the output circuitry 110 may be configured to combine the selected delay signals. Other circuit configurations that can generate an output clock signal having a characteristic based on a combination of characteristics of the selected delay signals may be possible. In general, various embodiments of the output circuitry 110 may include any of various circuit topologies or use any of various techniques to combine selected delayed signals and/or their associated characteristics to generate an output signal, non-limiting examples of which include mixing, (e.g., additive mixing, multiplicative mixing, phase mixing, frequency mixing, non-linear mixing, or combinations thereof), distortion, or logic operations such as adding or subtracting. Other types of signal combining may be possible.

In addition, for at least some example embodiments, the output circuitry 110 may be configured combine the selected delayed signals or otherwise generate the output clock signal according to and/or based on signal strengths of or associated with the selected delayed signals. Herein, a signal strength of, for, or associated with a given selected delay signal refers to an ability of the given selected delay signal to influence or affect a characteristic of the output clock signal. The stronger the signal strength of the given selected delay signal, the more a characteristic of the selected delay signal may influence or affect the characteristic of the output clock signal. The weaker the signal strength of the given selected delay signal, the less a characteristic of the selected delay signal may influence or affect the characteristic of the output clock signal.

To illustrate, and as described in further detail below, the falling transitions of the output clock signal may depend on a combination of phases of the selected delay signals. The stronger an associated signal strength of a given selected delay signal, the more the timings of the falling transitions of the output clock signal will depend on the phase of the given selected delay signal.

In addition, the signal strengths of the selected delay signals may be relative signal strengths in that each of the selected delay signals may have an associated signal strength relative to the signal strength of the other selected delay signal. Accordingly, a first relative signal strength of a first selected delay signal that is stronger than a second relative signal strength of a second selected delay signal means the characteristic of the output clock signal will depend more on or will be more influenced by first selected delay signal than by the second selected delay signal. For two signals with different associated signal strengths, the signal with an associated stronger signal strength may be referred to as the stronger signal, and the signal with an associated weaker signal strength may referred to as the weaker signal.

The output circuitry 110 may be configured to select or assign relative signal strengths for the selected delay signals that it receives. Upon making the selection, the output circuitry 110 may be configured to generate the output clock signal according to or dependent on the relative signal strengths that it selected. In particular example embodiments, where the output circuitry 110 generates falling transitions of the output clock signal based on a combination of the phases of the selected delay signals, in situations where the output circuitry 110 selects equal signal strengths for the selected delay signals, then the falling transitions of the output clock signal may depend on or be influenced equally by the phases of the selected delay signals. Alternatively, in situations where the output circuitry 110 selects a relative signal strength of a first selected delay signal to be stronger than the relative signal strength of a second selected delay signal, the phase of the first selected delay signal will influence the falling transition timings of the output clock signal more than the phase of the second selected delay signal.

The output circuitry 110 may be configured to generate the output clock signal according to the signal strengths selected for the selected delay signals in various ways. How the output circuitry 110 does so may depend on the configuration or topology it uses to combine the selected delay signals. In some example configurations, the output circuitry 110 may be configured select signal strengths for the selected delay signals by correspondingly setting or changing one or more characteristics of the selected delay signals themselves. As an example, if the output circuitry 110 determines to strengthen a signal strength of a given selected delay signal, the output circuitry 110 may do so by increasing a bias voltage level to change the delay of the signal transition.

For other example configurations, the output circuitry 110 may be configured to select signal strengths for the selected delay signals by correspondingly setting levels or values for characteristics of other signals, such as other voltages or other currents, that are generated based on or in response to the selected delay signals. For particular example configurations that include the steering circuitry 154 to receive the selected delay signals, the output circuitry 110 may select signal strengths, such as a pair of relative signal strengths from among multiple or a plurality of, pre-defined signal strengths, for the selected delay signals, by selecting or setting current amounts or magnitudes of the currents drawn through the branches. The current amounts that the output circuitry 110 selects or sets may correspond to the selected signal strengths. For these embodiments, the steering circuitry 154 may draw or steer currents through the branches, and the amounts of the currents steered or drawn through the branches may be in accord with, correspond to and/or be proportionate to the signal strengths of the selected delay signals. Accordingly, for a given selected delay signal, the stronger a signal strength for the given selected delay signal, the more current the branch receiving the given selected delay signal may draw. Similarly, the weaker a given signal strength for a given selected delay signal, the less current the branch receiving the given selected delay signal may draw. In terms of relative amounts, given two selected delay signals with relative signal strengths, if the relative signal strengths are equal to each other, then the branches receiving the respective selected delay signals may draw equal amounts of current. On the other hand, if the relative signal strength of a first selected delay signal is stronger than the relative signal strength of a second selected delay signal, then the branch receiving the first selected delay signal may draw a larger amount of current than the branch receiving the second selected delay signal.

Additionally, for some example configurations, the output circuitry 110 may select the relative signal strengths by selecting relative bias voltages and applying those selected bias voltages to the branches. In particular, each branch may be configured to receive a respective one of the relative bias voltages. The amount of current that a given branch may draw may depend on the level of the bias voltage that the given branch receives. In a particular embodiment, for a given bias voltage applied to a given branch, the higher the level of the given bias voltage, the more current the given branch can draw, and the lower the level of the given bias voltage, the less current the given branch can draw. However, other configurations may be possible, including those where increasing the levels of the bias voltages decreases the amounts of current through the branches. Accordingly, in order to select the relative signal strengths, the output circuitry 110 may be configured to select relative bias voltages corresponding to the relative signal strengths, and apply the relative bias voltages to the branches to draw currents through the branches at relative current amounts corresponding to the relative signal strengths.

In addition, the combination performed by the output circuitry 110 may be an interpolation process in that when combining the selected delay signals, the output circuitry 110 interpolates between a characteristic value of a characteristic of a first selected delay signal and a characteristic value of the characteristic of a second selected delay signal. By interpolating, the output circuitry 110 may generate the output clock signal with a characteristic having a value between the characteristic value of the first selected delay signal and the characteristic value of the second selected delay signal.

Additionally, the output circuitry 110 may be configured to interpolate between values of the characteristics of the selected delay signals based on and/or proportionate to the relative signal strengths of the selected delay signals. For example, when interpolating between the two values, if one selected delayed signal is stronger than the other, the output circuitry 110 may select a value for the characteristic of the output signal that is closer to the value associated with the stronger selected delay signal compared to the value associated with the weaker selected delay signal.

Also, for some example configurations, as described in further detail below, the output circuitry 110 may perform the interpolation by selecting among pre-defined states to vary the characteristic of the output clock signal between multiple or a plurality of values of the characteristic for multiple or a plurality of input clock signals. In a particular example embodiment where the output circuitry 110 interpolates between phases of the leading and lagging signals, referred to as phase interpolation between the leading and lagging phase signals, the steering circuitry 154 may accept pre-defined bias voltage levels each representative of a phase state between the phase of the leading phase signal and that of the lagging phase signal. An example of phase interpolation is described in further detail below with reference to FIG. 5.

The output circuitry 110 may be configured to select among relative signal strengths for the selected delay signals, including the leading phase signal and the lagging phase signal. The output circuitry 110 may do so in response to receipt of the combination signal C_ID it receives from the state circuitry 126. The combination signal C_ID that the control circuitry 102 outputs may indicate one of multiple or a plurality of pairs of relative signal strengths, such as pre-defined relative signal strengths, for combination of the select delay signals. As mentioned, the combination signal C_ID may be selected by the state circuitry 126 in response to the selection signal S_ID, such as through execution of a search algorithm. The combination signal C_ID may include voltage levels, digital codes, or other signals to indicate one of multiple or a plurality of pairs of relative signal strengths.

In some implementations, the combination signal C_ID may include an n-bit digital code, referred to as a combination code, corresponding to a specific pair of relative signal strengths for combination of the selected delay signals. For example, the duty cycle correction system 100 may include 8, 16, 32 or other number of pre-defined relative signal strengths. Accordingly, the system may use 3, 4, 5, or other number of n bits to indicate the different relative signal strengths. The control circuitry 102 may provide the combination code C_ID to the output circuitry 110 to control combination of the selected delay signals. Further detail of the state circuitry's 126 selection of pairs of pre-defined signal strengths is described below with reference to FIG. 6, and its execution of search algorithms to select the pairs of pre-defined signal strengths to generate the combination signals C_ID is described below with reference to FIGS. 7-10.

Additionally, in some implementations, the output circuitry 110 may include digital-to-analog converter (DAC) circuitry 152 to receive the combination signal C_ID. In response to receipt of the combination signal C_ID, the DAC circuitry 152 may generate bias signals according to relative signal strengths of the selected delay signals. Also, as described in further detail below, the output circuitry may receive the replica clock signal from the replica generation circuitry, and in response, drive the combination of the selected delay signals, including the leading delay signal and the lagging delay signal, during specific signal transitions, such as for rising transitions or for falling transitions, of the input clock signal. By driving the combination for rising transitions or for falling transitions, the output circuitry is configured to operate on a particular one of the rising transition or the falling transitions to effect duty cycle alterations through combination of the selected delay signals.

Further, the output circuitry 110 may generate an output clock signal that corresponds to the corrective direction determined by the control circuitry 102. As mentioned, the corrective direction is a direction determined by the control circuitry 102 to correct duty cycle distortion of a sample clock signal. The output circuitry 110 generates the output clock signal to correspond to a determined corrective direction in which to correct the duty cycle of the sample clock signal through combination of the leading and lagging phase signal in one or both of two ways.

First, the leading and lagging phase signals that the output circuitry 110 combines are selected by the selection circuitry 106 in response to the corrective direction indicated by the selection signal S_ID. Accordingly, which two of the delay signals (e.g., which of the early delay signal, the mid delay signal, and the late delay signal) that the output circuitry 110 combines corresponds to and/or is based on the corrective direction determined by the control circuitry 102. As such, the output clock signal may have a duty cycle that corresponds to the corrective direction in that the output clock signal may have a duty cycle that corresponds to a feature of the output clock signal that is based on a combination of features of leading and lagging phase signals that are selected based on the corrective direction.

A second way that the duty cycle may correspond to the corrective direction is that the signal strengths that the output circuitry 110 uses to combine the leading and lagging phase signals are based on the combination signal C_ID, which in turn is based on the corrective direction indicated by the selection signal S_ID. Accordingly, the output clock signal may have a duty cycle corresponding to the corrective direction in that the output signal may have a duty cycle that corresponds to a feature of the output clock signal that is based on a combination of features of leading and lagging phase signals according to signal strengths for the leading and lagging phase signals that are selected based on the corrective direction.

In sum, the output circuitry 110 may be configured to generate an output clock signal with a corrected duty cycle in response to receipt of the selected delay signals (e.g., the leading and lagging signals), the replica signal, and the combination signal C_ID. The output circuitry 110 may be configured to generate the output clock signal by combining the selected delay signals according to signal strengths indicated by the combination signal C_ID. The replica signal may drive the combination to effect the changes in the duty cycle.

Figure 2:
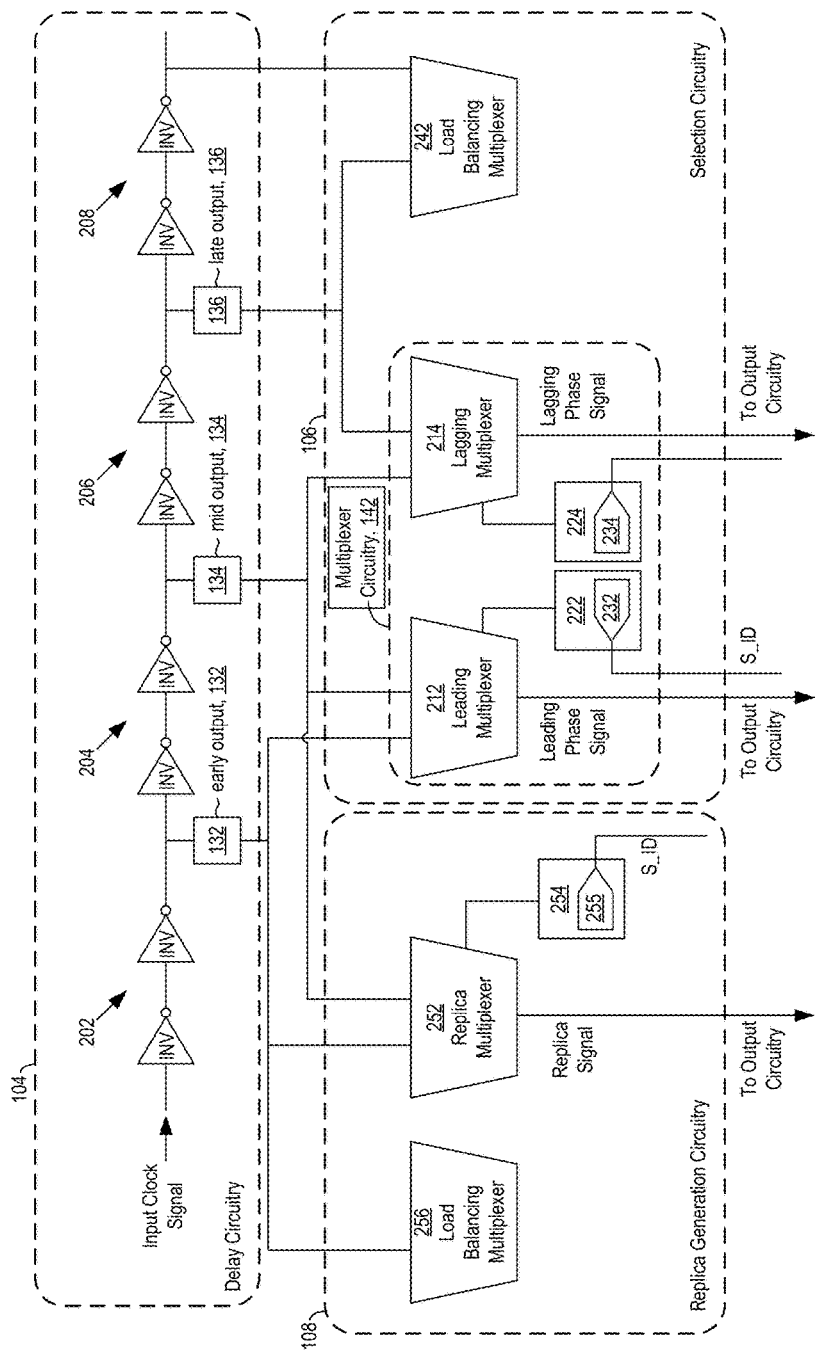
FIG. 2 shows example delay circuitry, example selection circuitry, and example replica generation circuitry.

Referring now to FIG. 2, illustrative example delay circuitry 104, example selection circuitry 106, and example replica generation circuitry 108 are shown.

The example delay circuitry 104 may include inverter pairs 202, 204, 206, 208, which may serve as discrete delay stages though the process of inverter delay. As used herein, a discrete delay stage may refer to circuitry designed to provide an incremental delay along a delay line. Each of the inverter pairs 202, 204, 206, 206 may be configured to provide a respective delay output to an associated one of the delay signal outputs 132, 134, 136. For some example configurations, the inverter pairs 202, 204, 206, 208 may provide incremental delays between delay outputs and ensure that at each delay signal output 132, 134, 136 the polarities of the delay signals are the same. In other words, the inverter pairs 202, 204, 206, 208 may maintain polarity of the input clock signal after imparting their respective delay. Although the example delay circuitry 104 is based on inverter pairs, other signal delay schemes may be implemented to construct delay circuitry. For example, voltage controlled inverter delay line schemes in which delay elements receive voltages and adjust their respective delays in response to changes in the levels of the voltages may be implemented.

The delay signal outputs 132, 134, 136 may be coupled to the selection circuitry 106 and replica generation circuitry 108. The path lengths from the delay signal outputs 132, 134, 136 to the multiplexer circuitry 142 may be matched for each of the delay signals to maintain their relative phase delays from the delay signal outputs 132, 134, 136 to the multiplexer circuitry 142.

The multiplexer circuitry 142 may include a leading multiplexer 212 and a lagging multiplexer 214. The leading multiplexer 212 may be coupled to the early output 132 and the mid output 134. The lagging multiplexer 214 may be coupled to the mid output 134 and the late output 136. Accordingly, the leading multiplexer 212 may select between the early and mid signals to serve as a leading phase signal, and the lagging multiplexer 214 may select between the mid and late signals to serve as the lagging phase signal.

The leading multiplexer 212 may include a control input 222, which may receive the selection signal S_ID to control selection performed by the leading multiplexer 212. In the example selection circuitry 106, the control input includes a DAC circuit 232, which may receive a digital selection code, as the selection signal S_ID. The DAC circuit 232 may generate a control output that causes the leading multiplexer 212 to select the leading phase signal (from among the early and mid signals) in accord the corrective direction specified by the selection code. The leading multiplexer 212 may output the early signal or the mid signal it selects as the leading signal to the output circuitry 110.

The lagging multiplexer 214 may include a control input 224, which may receive the selection signal S_ID. The control input 224 includes a DAC circuit 234, which may receive a selection code, as the selection signal S_ID. The DAC circuit 234 may generate a control output that causes the lagging multiplexer 214 to select the lagging phase signal (from among the mid and late signals) in accord the corrective direction specified by the selection code. The lagging multiplexer 214 may output the early signal or the mid signal it selects as the lagging signal to the output circuitry 110.

The selection circuitry 106 may further include load balancing multiplexer 242. The load balancing multiplexer 242 may be coupled to the delay signal outputs 132, 134, 136 in parallel to the leading multiplexer 212 and lagging multiplexer 214. The load balancing multiplexer 242 may mitigate signal distortion on the signal paths between the delay signal outputs 132, 134, 136 and the multiplexer circuitry 142.

The replica generation circuitry 108 may include a replica multiplexer 252. The replica multiplexer 252 may be coupled to the early output 132 and mid output 134. The replica multiplexer 252 may include a control input 254 including a DAC 255 that receives the selection signal S_ID and matches the signal selection of the leading multiplexer 212. In some embodiments, the control input 254 may be coupled to the control input 224 to bind their operation to one another. Accordingly, in various implementations, the replica multiplexer 252 may mimic the operation and selection of the leading multiplexer 212.

The replica generation circuitry 108 may further include a load balancing multiplexer 256 coupled in parallel to the replica multiplexer 252. The load balancing multiplexer 256 may be impedance matched to the replica multiplexer 252. The replica multiplexer 252 send its output, e.g., the replica signal, to the output circuitry 110 to drive the output circuitry, as discussed below.

Figure 3:
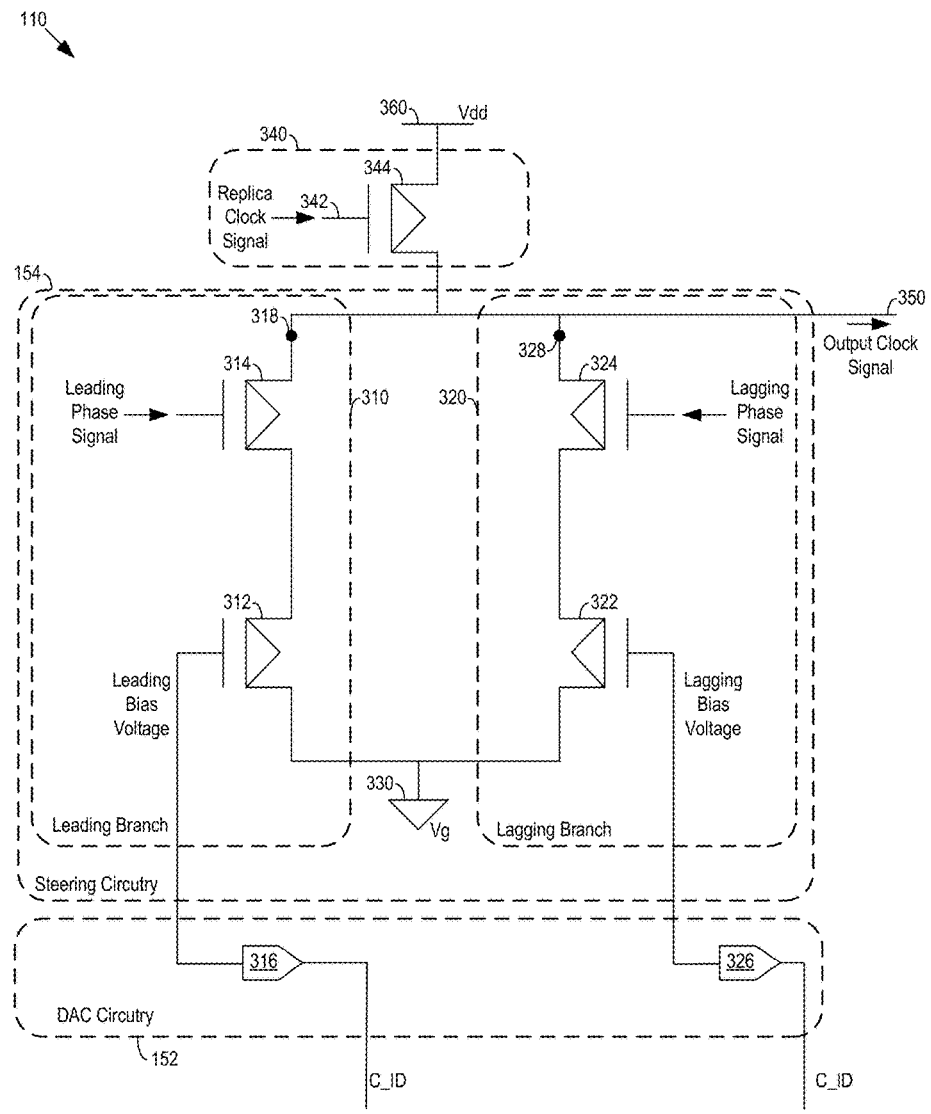
FIG. 3 shows a block diagram of example output circuitry.

FIG. 3 shows a block diagram of example output circuitry 110. In addition to the DAC circuitry 152 and the steering circuitry 154, the output circuitry 110 may further include a voltage reference 330 where a reference voltage Vg 330 is generated, driving circuitry 340, a signal output 350 where an output clock signal is generated, and a supply node 360 where a supply voltage Vdd is received.

As used herein, reference voltage Vg refers to any constant reference voltage level within a circuit generated at a common reference or ground reference. The supply voltage Vdd may be at a level that is with reference to the reference voltage Vg. The voltage level of the supply voltage Vdd relative to the reference voltage Vg may determine a direction of current flow through the output circuitry 110. In the example configuration shown in FIG. 3, current may flow through a circuit from the supply voltage Vdd to the reference voltage Vg.

The steering circuitry 154 may be configured to steer current to generate the output clock signal at the signal output 350. In general, a steering circuit steers current portions of a sum current through a plurality of branches. For some examples, the sum current may be sourced to a node to which the branches are coupled. The branches act as dividers and divide the sum current into current portions, where each current portion flows through one of the paths. In addition or alternatively, the branches include first ends coupled to a node where a voltage is generated, and the voltage allows the current portions to flow through the branches. A sum of the amounts of the current portions flowing through the branches may be equal to the amount of the sum current. The steering circuit may be configured to steer the sum current through the branches by directing the current portions to flow through the branches or controlling the flow of the current portions through the branches at selected or determined amounts, which may include relative amounts or proportions of amounts relative or proportionate to each other.

In the example configuration of FIG. 3, the steering circuitry 154 may include a plurality of branches, including a leading branch 310 and a lagging branch 320. The leading branch 310 and the lagging branch 320 may be connected in parallel with each other, and include respective first ends coupled to the signal output 350 and respective second ends connected to the ground reference 330. Portions of a sum current, referred to as a leading current and a lagging current, may flow at respect amounts, levels, or amplitudes through the leading and lagging branches 310, 320, respectively.

In further detail, the leading branch 310 may be configured to receive the leading phase signal and draw the leading current based on the strength of the leading phase signal. Similarly, the lagging branch 320 may be configured to receive the lagging phase signal and draw the lagging current based on the strength allocated for the lagging phase signal.

In some example configurations, the leading and lagging branches 310, 320 may include transistors, such as NMOS transistors, to receive the leading and lagging signals. For example, as shown in FIG. 3, the leading branch 310 may include a leading signal transistor 314 that includes a gate configured to receive the leading phase signal. The leading signal transistor 314 may be configured to control the leading current through a leading node 318 into the leading branch 310 in response to receipt of the leading phase signal. Similarly, the lagging branch 320 may include a lagging signal transistor 324 that includes a gate configured to receive the lagging phase signal. The lagging signal transistor 324 may be configured to control the lagging current through a lagging node 328 into the lagging branch 320 in response to receipt of the lagging phase signal.

The leading and lagging branches 310, 320 may also include a respective second transistor connected in series with the leading signal transistor 314 or the lagging signal transistor 324. In particular, the leading branch 310 may further include a leading bias transistor 312 connected in series with the leading signal transistor 314, and the lagging branch 320 may further include a lagging bias transistor 322 connected in series with the lagging signal transistor 324.

The steered leading and lagging currents drawn through each of the branches 310, 320 may have associated signal strengths corresponding to the signal strengths of the leading and lagging phase signals. The relative signal strengths of the steered currents at the leading and lagging nodes 318, 328 may be controlled by the leading and lagging bias transistors 314, 324. The relative signal strengths of the leading and lagging currents may be defined by the relative current amplitudes at the leading and lagging nodes 318, 328. In the example configuration shown in FIG. 3, the higher the amplitude of a current through a respective branch, the higher the signal strength associated with a given steered current, and the lower the amplitude of the current through the branch, the lower the signal strength associated with the current. Other configurations may be possible, including those where a higher current amplitude corresponds to a lower signal strength.

In addition, the DAC circuitry 152 may include a leading DAC 316 and a lagging DAC 326. The leading and lagging DACs 316, 326 may receive a combination code as the combination signal C_ID from the state circuitry 126. The leading DAC 316 may convert the combination code to a leading bias voltage and provide the leading bias voltage to the gate of the leading bias transistor 312. The lagging DAC 326 may convert the combination code to a lagging bias voltage and provide the lagging bias voltage to the gate of the lagging bias transistor 322.

The driving circuitry 340 may include a driving input 342 which may be a gate of driving transistor 344. The driving input 342 may receive the replica signal from the replica generation circuitry 108. The driving transistor 344, signal output 350, and the leading and lagging branches 310, 320 may be connected in parallel to one another. The driving transistor 344 sits in series between the supply voltage 360 and the leading and lagging branches 310, 320. The driving transistor 344 is also coupled in series between the supply voltage 360 and the signal output 350.

The example output circuitry 110 is shown in FIG. 3 with NMOS transistors. Accordingly, when on, the driving transistor 344 may pull up the signal output to Vdd. Further, when on, the signal transistors 314, 324 may pull down the signal output to Vg. Accordingly in the example NMOS output circuitry 110 shown in FIG. 3, the combination of the leading and lagging phase signals may determine the timing of the falling transition of the output clock signal. However, other output circuitry designs may be implemented. For example, complementary output circuitry may be designed using PMOS circuitry and exchanging the positions of Vdd and Vg. In the complementary output circuitry based on PMOS transistors, the combination of the leading and lagging phase signals may affect the rising transition of the output clock signal.

During operation, the steering circuitry 154 steers current along the leading and lagging branches 310, 320 in accord with the leading and lagging phase signals. By using the leading and lagging phase signals to steer the current along these branches, the generated output clock signal at the signal output 350 has features, such as falling transitions and/or a duty cycle, resulting from a combination of the leading and lagging phase signals. Additionally, since the leading and lagging signal are selected based on the determined corrective direction, the steering circuitry 154 generates the output clock signal with features, such as falling transitions and/or a duty cycle, corresponding to the corrective direction and the steered current.

Figure 4:
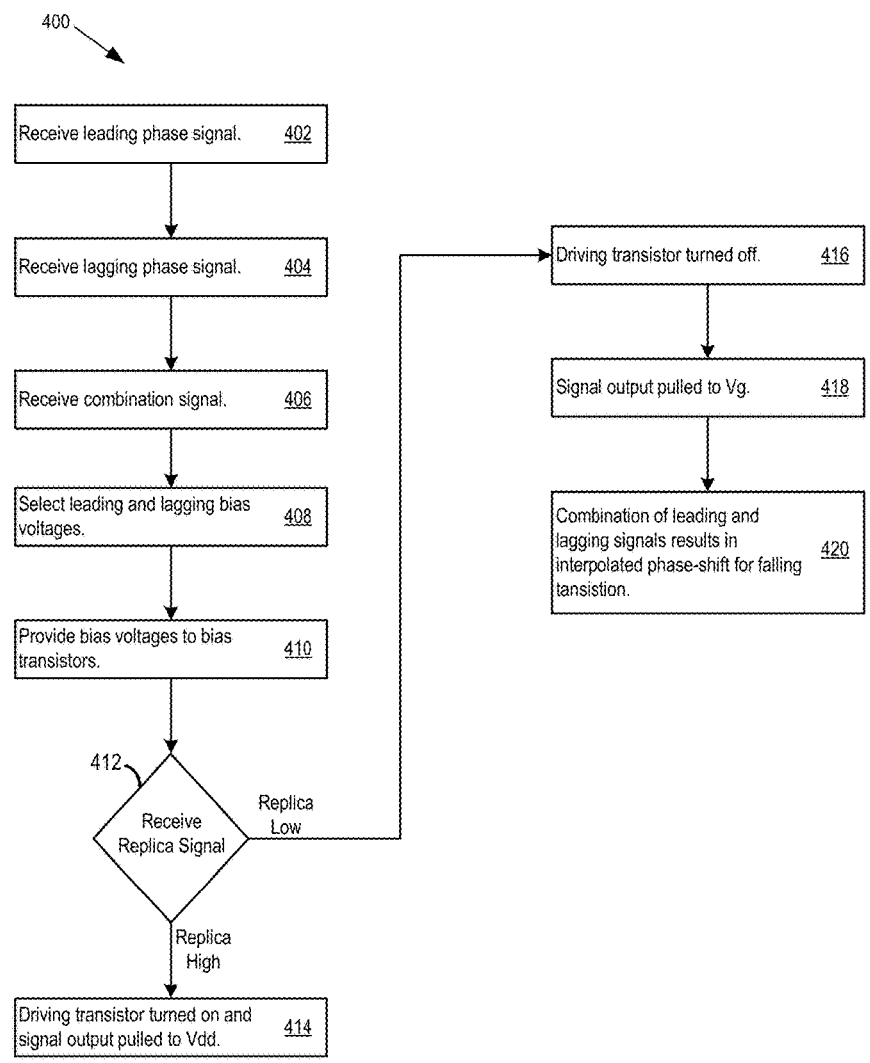
FIG. 4 shows a flow diagram showing example operation of the example output circuitry of FIG. 3.

Referring now to FIG. 4, a flow diagram showing example operation 400 of the example output circuitry of FIG. 3 is shown. At block 402, the gate of the leading signal transistor 314 may receive the leading phase signal from the selection circuitry 106. At block 404, the gate of the lagging signal transistor 324 may receive the lagging phase signal from the selection circuitry 106. At block 406, the leading DAC 316 and lagging DAC 326 may receive the combination signal C_ID from the control circuitry 102. At block 408, the leading DAC 316 and lagging DAC 326 may select leading and lagging bias voltages responsive to the combination signal C_ID. At block 410, the leading DAC 316 and lagging DAC 326 may provide the leading and lagging bias voltages to gates of the leading and lagging bias transistors 312, 322 which sets the relative signal strengths for the current through the leading and lagging branches within the steering circuitry 154, and in turn the relative signal strengths for combination of the leading and lagging phase signals. By controlling the signal strength, e.g., the current amplitude, of the current drawn through the leading branch 310, the leading bias transistor 312 sets the signal strength associated with the leading phase signal. By controlling the signal strength, e.g., the current amplitude, of the current drawn through the lagging branch 320, the lagging bias transistor 322 sets the signal strength associated with the lagging phase signal. At block 412, the driving input 342 receives the replica signal.

Referring again to FIG. 3, when the replica signal is in a low state, the driving transistor 344 is turned on and the signal output 350 is pulled to Vdd. When the replica signal is in the high state, the driving transistor 344 is turned off and the signal output 350 floats with respect to Vdd. Accordingly, while the signal is floating with respect to Vdd, the leading and lagging branches 310, 320 may pull the signal output 350 to Vg. Thus, the driving circuitry 340 may drive the output circuitry 110 by controlling when the signal output 350 is pulled to Vdd and when the signal output 350 may be pulled to Vg.

The bias transistors 312, 322 may be configured to set the signal strengths of the currents, and in turn signal strengths of the leading and lagging signals. The bias transistors 312, 322 may do so by controlling the amount of the currents that can flow in each of the leading and lagging branches 310, 312. Specifically, the bias transistors 312, 322 may restrict current flow, e.g., current magnitude, through their respective branches 310, 320. Accordingly, providing selected biases to the gates of the bias transistors effectively selects a signal strength for the leading signal on the leading branch 310 and for the lagging signal on the lagging branch 320. Accordingly, the output circuitry 110 may control the relative signal strengths of the leading and lagging signals on their respective branches by selecting bias voltages to apply to the gates of the bias transistors. The current flow through each of the branches may determine the contribution by that branch in pulling the signal output 350 to Vg.

In embodiments where one bias transistor is on and the other bias transistor is off, the process of pulling the signal output 350 to Vg will be controlled by the branch with the transistor that is on. In embodiments where both bias transistors are on, the process of pulling the signal output 350 to Vg will be controlled by a combination of the leading and lagging phase signals on both branches.

In general, when a first signal is combined with second signal that is a phase-shifted version of the first signal, the resultant output signal is another version of the first signal at a second phase-shift between the phases of the first signal and the second signal. Accordingly, when the steering circuitry 154 creates a combination of the leading and lagging phase signals the result is an output clock signal with a phase between the leading and lagging phase signals. Accordingly, when combining the leading and lagging phase signals, the steering circuitry 154 may interpolate between the phases of the leading and lagging phase signals, resulting in a output clock signal with a phase corresponding to the interpolation. The relative signal strengths of the leading and lagging phase signals determines whether the steering circuitry 154 generates the output clock signal with a phase closer to that of the leading phase signal or that of the lagging phase signal. Accordingly, setting the bias voltages of the bias transistors 312, 322 allows the steering circuitry 154 to vary the phase of the output clock signal from the branches 310, 320 from the phase of the leading phase signal to that of the lagging phase signal.

In response to receipt of the combination signal C_ID, the DACs 315, 326 may be configured to set the bias voltages applied to the bias transistors 312, 322 in pre-defined steps. Doing so allows the creation of pre-defined relative signal strengths of the current drawn through the branches 310, 320, and in turn the signal strengths selected for the leading and lagging phase signals, which results in step-wise phase-shifts between the phase of the leading phase signal and the phase of the lagging phase signal.

When selecting the signal strengths in step-wise phase shifts, interpolation refers to selecting among pre-defined states to vary an output clock signal value of a characteristic between multiple or a plurality of values of the characteristic for multiple or a plurality of input clock signals. For example, in the case of phase interpolation between the leading and lagging phase signals, the steering circuitry 154 may accept pre-defined bias voltage levels each representative of a phase state between the phase of the leading phase signal and that of the lagging phase signal.

Figure 5:
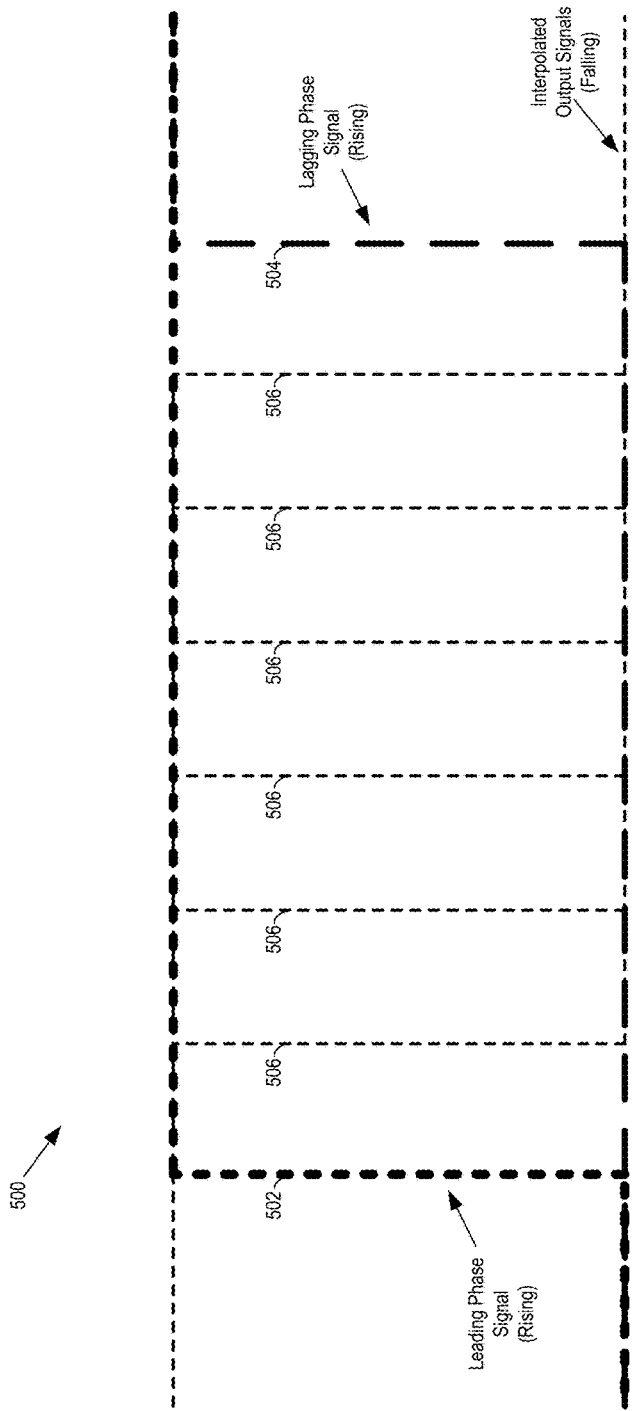
FIG. 5 shows example interpolation between phase of an example leading phase signal and that of an example lagging phase signal.

FIG. 5 shows example interpolation 500 between phase of an example leading phase signal and that of an example lagging phase signal. The rising transition 502 of the leading phase signal is phase-advanced with respect to rising transition 504 of the lagging phase signal. The interpolation 500 between the leading and lagging phase signals generates selectable step-wise phase shifts between the phase of the leading phase signal and that of the lagging phase signal. The selectable step-wise phase shifts are marked via their respective falling transitions 506, which lie between the rising transition 504 of the lagging phase signal and the rising transition 502 of the leading phase signal.

Additionally or alternatively, at a given moment in time during a duty cycle correction process, the DAC circuitry 152 may be configured select a pair of pre-defined bias voltages, and bias the leading and lagging bias voltage transistors 312, 322 with the pair of pre-defined bias voltages. In particular, the DAC circuit 316 may bias the leading bias voltage transistor 312 with a first bias voltage of the pair, and the DAC circuit 326 may bias the lagging bias voltage 322 with a second bias voltage of the pair.

The first bias voltage of the pair may correspond to a particular, pre-defined signal strength for the leading phase signal and/or for a particular pre-defined signal strength (e.g., a current amplitude) for current drawn through the leading branch 310. In addition, the second bias voltage of the pair may correspond to a particular, pre-defined signal strength for the lagging phase signal and/or for a particular pre-defined signal strength (e.g., a current amplitude) for current drawn through the lagging branch 320. Accordingly, in response to the DAC circuitry 152 selecting the pair of pre-defined bias voltages, the leading branch 310 may be configured to draw a current with a pre-defined signal strength corresponding to the first bias voltage of the pair, and the lagging branch 320 may be configured to draw a current with a pre-defined signal strength corresponding to the second bias voltage of the pair.

When selecting a bias voltage pair, the DAC circuitry 152 may select from among a plurality of different bias voltage pairs. Each pair voltage bias pair may correspond to a different one of a plurality of pre-defined pairs of signal strengths. In general, each pair of predefined signal strengths may include a first pre-defined signal strength (or relative pre-defined signal strength) for the leading phase signal and a second pre-defined signal strength (or relative pre-defined signal strength) for the lagging phase signal. In addition or alternatively, each pre-defined signal strength pair may include a first pre-defined signal strength for a current drawn through the leading branch 310 and a second pre-defined signal strength for current drawn through the lagging branch 320.

In particular example embodiments, different pre-defined pairs may correspond to different combinations of first and second bias voltages and/or first and second pre-defined signal strengths. However, while the different pairs may correspond to different combinations of amounts of current, a sum of the currents through the branches may be the same, irrespective of which pair the DAC circuitry 152 selects at a given moment during the duty cycle correction process. For a plurality of pairs of pre-defined bias voltages, the pre-defined bias voltage level for a first signal in a pair may increase by a step when a voltage level for a second signal in the pair may decrease by a step. Accordingly, the combined signal strength for the currents and/or the leading and lagging signals may remain constant as the DAC circuitry 152 selects different pairs of bias voltages and biases the bias voltage transistors 312, 322 with the different pairs at various times during a duty cycle correction process.

In some embodiments, a first bias signal in a pair may increase or decrease without a corresponding change in the second bias signal. Accordingly, the DAC circuitry 152 may select pairs that step through the available signal levels of the first and second bias signals without maintaining a constant combined amplitude.

Figure 6:
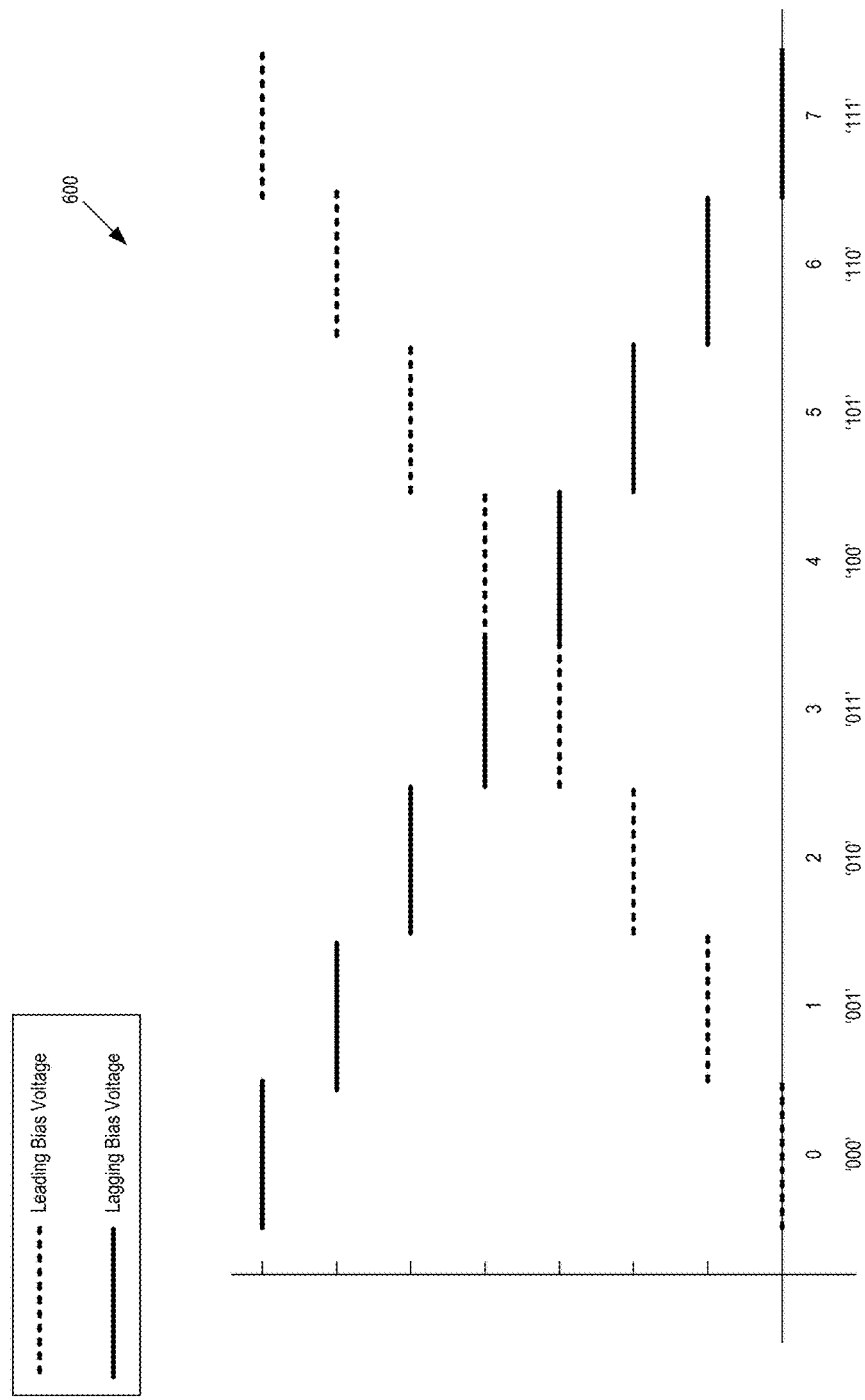
FIG. 6 shows example pre-defined bias voltage levels to control the relative signal strength for leading and lagging phase signals.

FIG. 6 shows example pre-defined bias voltage levels 600 to control the relative signal strengths for leading and lagging phase signals. For the example bias voltage levels 600, the leading bias level decreases by a step when the lagging bias level increases by a step, and vice versa.

The example pre-defined bias voltage levels 600 include 8 selectable bias voltage levels (e.g., levels 0-7). Accordingly, the control circuitry 102 may control which of the levels is selected by sending out a combination signal C_ID is indicative of a 3-bit value. However, other numbers of selectable bias voltage levels may be used. For example, 16, 32, or $2^n$ levels may be used where C_ID is indicative of 4, 5, or n-bit values. Further, various implementations, may use numbers of selectable bias voltage levels which are not powers of two, such as 12 levels, 20 levels, or other numbers of levels.

Referring again to FIG. 3, pulling up the voltage at the signal output 350 to Vdd prevents the combined output from the steering circuitry 154 (e.g., the combined output from the leading and lagging branches 310, 320) from affecting the signal output 350. Accordingly, when the driving transistor 344 is on, the steering circuitry 154 does not affect the signal output 350. When the driving transistor is off, the signal output 350 is floating with respect to Vdd and may be affected by the output of the steering circuitry 154, e.g., pulled to Vg by the steering circuitry. Thus, the driving circuitry 340, responsive to the replica signal, drives the output circuitry 110 during a specific signal transition (either the rising transition or the falling transition) for each of multiple or a plurality of cycles of the input clock signal, the replica clock signal or one of the other multiple delay signals. The driving circuitry 340 drives the output circuitry 110 by driving combination of the leading phase signal and the lagging phase signal, such as by determining when, such as on which specific transition (i.e., the rising transition or the falling transition), the steering circuitry 154, may affect the signal output. The signal at the driving input 342, e.g., the replica signal, controls this driving by the driving circuitry 340.

Accordingly, the driving circuitry 340 may control which portion of a signal cycle the steering circuitry 154 affects. For example, the driving circuitry 340 may drive the output circuitry 110 such that the steering circuitry 154 phase shifts one transition within a cycle but not a second transition during the same cycle. In some embodiments, the driving circuitry may drive the output circuitry 110 such that the steering circuitry 154 phase shifts falling transitions of a input clock signal, but not rising transitions of the input clock signal. Phase-shifting falling transitions but not rising transitions of a signal results in an adjustment of the duty cycle for the input clock signal. Accordingly, the output circuitry 100 may adjust a duty cycle adjustment to an input clock signal by phase-shifting one of either the falling or rising transitions within the input clock signal.

In at least some implementations, replica generation circuitry 108 (FIG. 1) generates the replica signal to be a copy of the leading phase signal, in that the replica generation circuitry 108 generates the replica signal with the same phase as the phase of the leading phase signal. When the replica signal and the leading phase signal have the same phase, the driving transistor 344 pulls the signal output 350 to Vdd in accord with the falling transition of the leading phase signal. Accordingly, the driving transistor 344 fixes the rising transition at the signal output 350 to the falling transition of the leading phase signal. However, the driving transistor 344 allows the signal output 350 to float in accord with the rising transition of the leading phase signal. Accordingly, the rising transitions of both the leading and lagging signal may contribute to the process of pulling the signal output 350 to Vg because the rising transition of the leading phase signal occurs before the rising transition of the lagging phase signal. As a result, the falling transition at the signal output 350 will be controlled by the phase-shifted combination of the leading and lagging phase signals.

Referring now to block 414 of FIG. 4, when the replica signal is in a low state, the driving transistor 344 is turned on and the signal output 350 is pulled to Vdd by the driving transistor 344. When the replica signal is in the high state, the driving transistor 344 is turned off and the signal output 350 floats with respect to Vdd at block 416. While the driving transistor 344 is turned off, the steering circuitry 154, in accord with a combination of the leading and lagging phase signals, may pull down the voltage level of the signal output 350 to Vg at block 418. At block 420, in response to the steering circuitry 154 pulling down the voltage level in accord with the combination of the leading and lagging signals, the steering circuit generates the falling transition of the clock signal with an interpolated phase-shift for the falling transition at the signal output 350. The falling transition has an interpolated phase shift in that the timing of the falling edge corresponds to a phase shift to a phase in between the respective phases of the leading and lagging phase signals.

Figure 7:
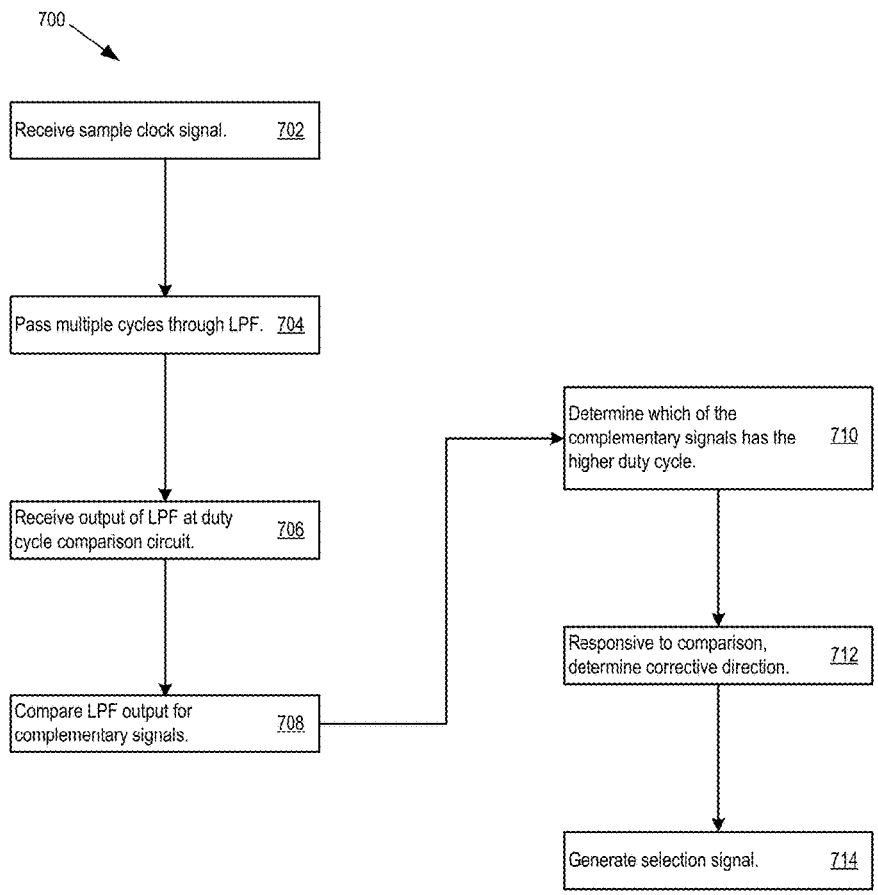
FIG. 7 shows a flow diagram showing example operation of example duty cycle detection circuitry.

Referring now to FIG. 7, a flow diagram showing example operation 700 of the example duty cycle detection circuitry 120 is shown. At block 702, the duty cycle detection circuitry 120 may receive a sample clock signal including a pair of complementary signals. At block 704, the example duty cycle detection circuitry 120 may pass multiple or a plurality of cycles of sample clock signal through LPF 122. At block 706, the duty cycle comparison circuit 124 may receive the output of the LPF 122. At block 708, the duty cycle comparison circuit 124 may compare the LPF outputs for the pair of complementary signals. Responsive to the comparison, the duty cycle comparison circuit 124 may determine a duty cycle error by determining which of the pair of complementary signals has a higher duty cycle at block 710. At block 712, based on the duty cycle error, the duty cycle comparison circuit 124 determines a corrective direction to correct the duty cycle error. For example, for a system with a 50% target duty cycle, the duty cycle comparison circuit 124 may determine a corrective direction that equalizes the duty cycles of the pair of complementary signals. Responsive to the corrective direction, the duty cycle detection circuitry 120 may generate a selection signal S_ID indicative of the corrective direction at block 714.

Referring back to FIG. 1, via its operation, the state circuitry 126 may implement or execute a search algorithm to determine one or more combination signals C_ID during a duty cycle correction process. As used herein, a search algorithm is a set of instructions that defines a progression of steps from initial conditions to a defined end condition. To progress through the search algorithm, the state circuitry 126 uses current conditions and one or more previous states of the state circuitry 126 to determine the current state of the state circuitry 126. Based on the current state, the state circuitry 126 may generate the combination signal C_ID.

For example, when the search circuitry 126 executes a search algorithm, the search circuitry 126 may search through a plurality or a group of pairs of pre-defined signal strengths and/or a plurality of pairs of pre-defined bias voltages, such as those described with reference to FIG. 6. The plurality or pairs of pre-defined signal strengths or pairs of bias voltages may listed or stored in any of various ways or formats, such as in the form of a listing, a table, a database, or any other searchable or selectable format. The search circuit 126 may be configured to access the plurality of pairs, search through the plurality of pairs, and select one or any of the plurality of pairs in response to a give selection signal S_ID. Upon selecting a pair from the plurality of pairs according to the search algorithm, the state circuitry 126 may output the selected pair in the form of the combination signal C_ID to the output circuitry 110.

The search circuitry 126 may be configured to execute any of various types of search algorithms. Two types of searches, a linear search and a binary search, are now described with reference to FIGS. 8 and 9, respectively.

In performing the linear search, the state circuitry 126 may progress through states, with each state corresponding to one of the pre-defined pairs of signal strengths or pre-defined pairs of bias levels corresponding to the signal strengths. In some embodiments, the progression of states may be performed with reference to the lagging phase signal. The states may extending from an initial state corresponding to a pre-defined pair that has the greatest strength for the lagging phase signal to a last state corresponding to a pre-defined pair that has the weakest strength for the lagging phase signal. At each state in the progression, the selection circuitry126, may decrement the strength of the lagging phase signal by one bias voltage level. Other ways of establishing the states with reference to the lagging phase signal or with reference to the leading phase signal may be possible.

Figure 8:
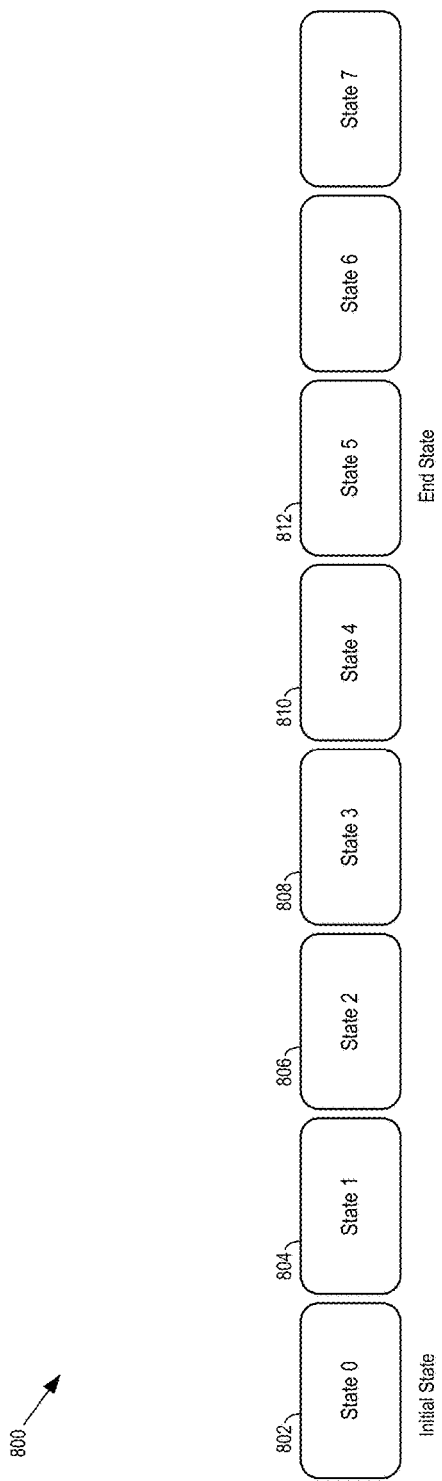
FIG. 8 shows an example linear search.

FIG. 8 shows an example linear search 800. In executing the linear search 800, the state circuitry 126 begins an initial state 802 and progresses through the states, such as states 804, 806, 808, 810, in order until the state circuitry 126 reaches an end state 812. The end state 812 may be any of the states that the state circuitry 126 is at when the state circuitry 126 identifies an end condition.

In some example configurations, the end condition may correspond to a switch or a flip in a corrective direction indicated by the selection signal S_ID. In particular, the state circuitry 126 may be prompted to begin the linear search 800 in response to detection of an initial selection signal S_ID received from the duty cycle detection circuitry 120. The initial selection signal may indicate an initial corrective direction. The state circuitry 126 may proceed through the linear search 800 and move to next states as long as the selection signal S_ID indicates the same initial corrective direction. When the selection signal S_ID flips—i.e., changes its corrective direction from the initial corrective direction to an opposite corrective direction—the state circuitry 126 may determine that the end condition is met.

The example linear search 800 in FIG. 8, which is merely illustrative, shows eight states, including State 0 to State 7. Each state may correspond to one of the pairs of signal strengths and/or voltage bias levels. In the example shown in FIG. 8, the state circuitry 126 identified the end condition at State 5. However, in some embodiments, an end condition for a particular state (e.g., State 5) may involve progressing pass that state on to another state (e.g., State 6), detecting a condition change, and, in response, returning to the particular state.

In some duty cycle correction processes, the state circuitry 126 may progress through all of the states provided by the linear search algorithm without detecting a switch or flip in the corrective direction as indicated by the selection signal S_ID. For these situations, the state circuitry 126 may determine an end condition is met when the state circuitry 126 has searched all of the states and corresponding available pre-defined pairs of signal strengths before or without detecting a change in the corrective direction relative to the initial corrective direction. Accordingly, even if the state circuitry 126 may terminates the linear search without detecting a flip in corrective direction, the output circuitry 110, by the end of the linear search, will still be generating an output clock signal with a duty cycle that offers the most correction for the determined corrective direction. For example, when the corrective direction initially indicates that the duty cycle is high (e.g., above a target duty cycle) and the state circuitry 126 progresses through all of the states without detecting a flip in the corrective direction as indicated by the selection signal S_ID, the state circuitry 126 may determine that no pair of signal strengths is available that will cause the output circuitry 110 to generate the output clock signal at the target duty cycle. In response, the state circuitry 126 may terminate the search at the state that yields an output duty cycle closest to the target duty cycle, which in the example, is the state that causes the output circuitry 110 to generate the output clock signal with the lowest duty cycle.

Additionally or alternatively, the state circuitry 126 may implement or execute a binary search algorithm to determine one or more combination signals C_ID during a duty cycle correction process. For example, the state circuitry 126 may select a pre-defined pair of signal strengths bisecting a group of pre-defined pairs of signal strengths that have not yet been searched. The conditions at that selected pre-defined signal strength may indicate to the state circuitry 126 whether to continue the search within the states between the initial state and the bisecting state or within the states not between the initial state and the bisecting state. For example, if the corrective direction at the bisecting state is opposite that of the corrective direction for the initial state, the state circuitry 126 may determine to continue the search within the states between the initial state and the bisecting state. The binary search algorithm may continue the search until an end condition is met. For example, in some embodiments, and end condition may include detecting a change in corrective direction after executing a step of a pre-defined minimum bisection size for the binary search algorithm.

If the corrective direction is the same as for the bisecting state and the initial state, the state circuitry 126 may determine to continue the search within the states not between the initial state and the bisecting state. The bisection process may continue until an end condition is met. For example, an end condition may be met when the bisection process leaves only one or two states as possible search candidates. Additionally or alternatively, an end condition may be met when the remaining possible search candidate states falls below a threshold number. For example, when the number of possible states falls below the threshold, the state circuitry 126 may determine to choose a final bisecting state in the middle of or near the middle of the remaining possible candidates.

Figure 9:
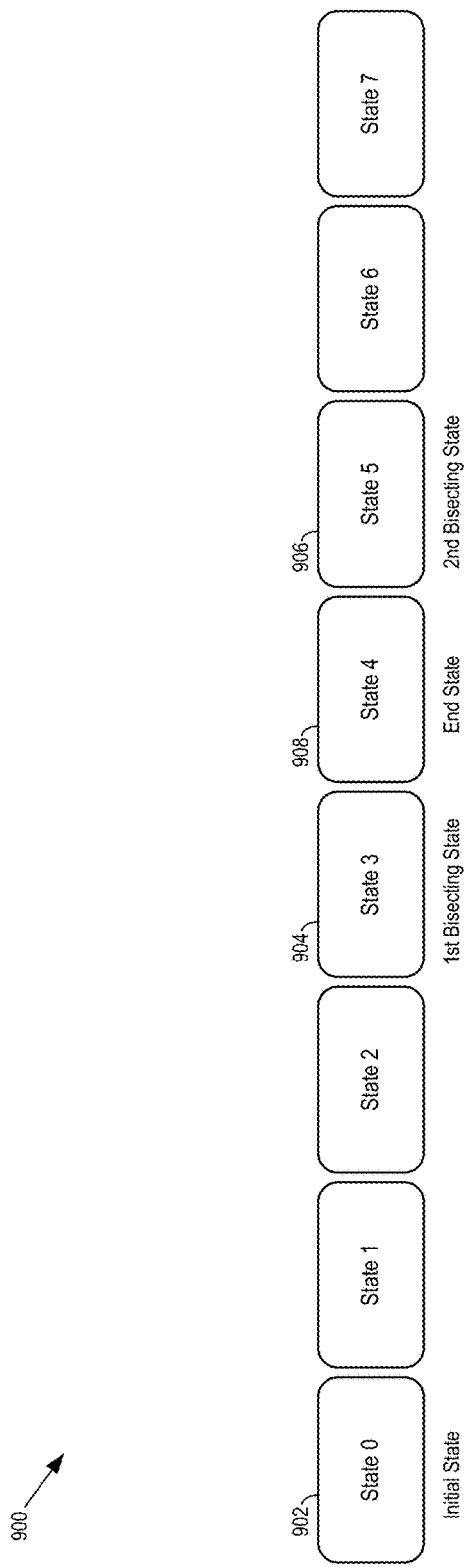
FIG. 9 shows an example binary search.

FIG. 9 shows an example binary search 900. The state circuitry 126 may start at an initial state 902 and cause the duty cycle detection circuitry 120 to the initial corrective direction. The state circuitry 126 may select a first bisecting state 904. In the example, the corrective direction at the first bisecting state 904 is the same as the initial corrective direction. Accordingly, the state circuitry 126 selects a second bisecting state 906 that is not between the initial state 902 and the first bisecting state 904. In the example, the duty cycle detection circuitry 120 determines that the corrective direction at the second bisecting state 906 is not the same as the corrective direction at the first bisecting state 904. Accordingly, the state circuitry 126 selects the state 908 between the first bisecting state 904 and the second bisecting state 906 as the end state 908 and terminates the binary search.

Although example binary and linear searches are discussed, the state circuitry 126 may be configured to execute any of various other search algorithms in order to search through pre-defined pairs of signal strengths of bias voltages and determine combination signals C_ID. For example, the state circuitry 126 may use a centered search algorithm that is centered on a starting point and searches states in order of increasing distance from the starting point. Additionally or alternatively, the state circuitry 126 may use differential analyses of the corrective direction to converge on an end condition.

Figure 10:
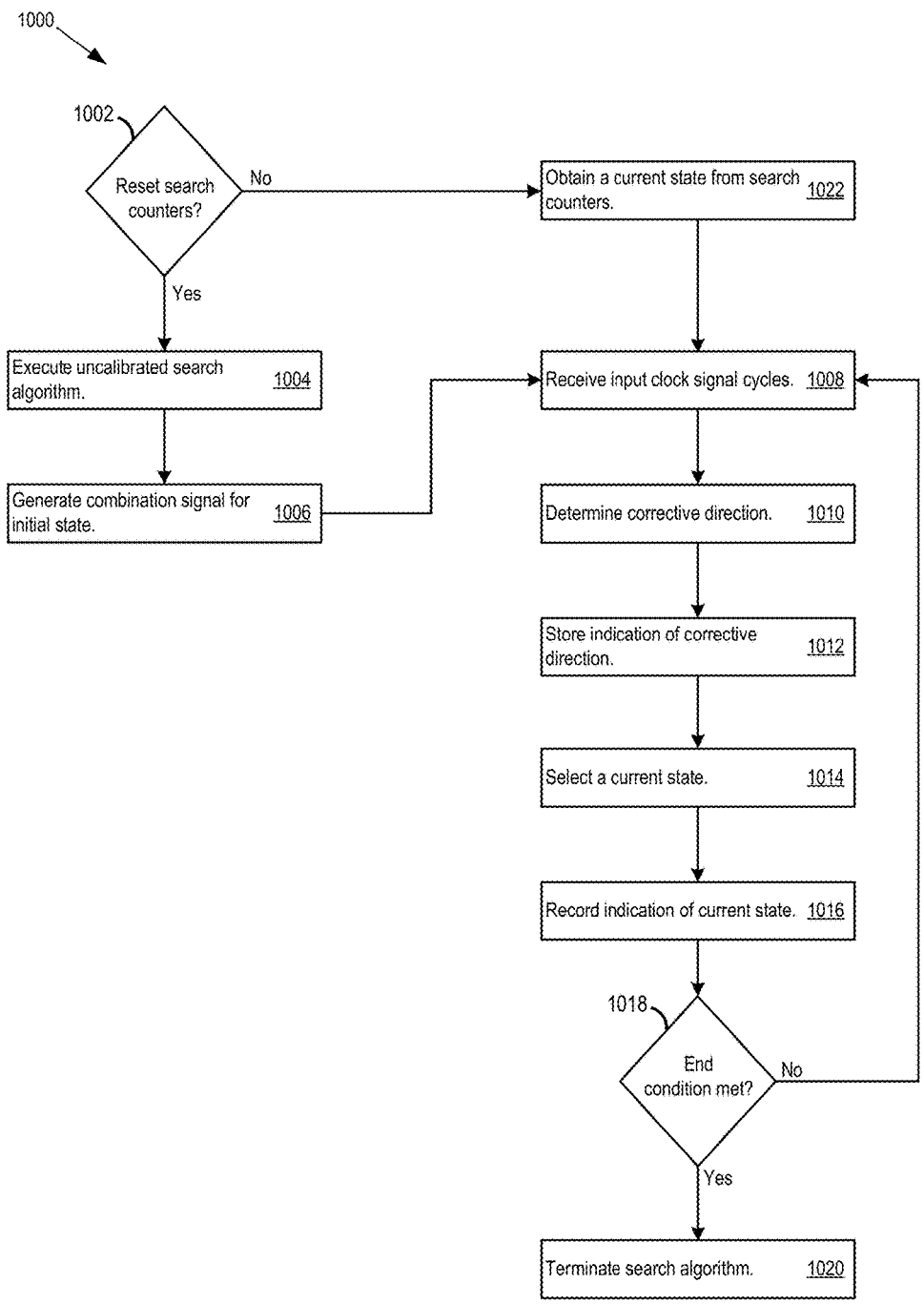
FIG. 10 shows a flow diagram showing operation of example state circuitry.

Referring now to FIG. 10, a flow diagram 1000 showing operation of example state circuitry 126, as it may operate in a duty cycle correction process, is shown. At block 1002, the state circuitry 126 may determine whether to reset search counters, such as the search counters 128. As used herein, a search counter, such as one of the search counters 128, refers to a register, bit position, a flag, or other memory location that stores a numerical value to support the tracking of search progress. As the state circuitry 126 progresses through a search algorithm, the state circuitry 126 may alter search counter values to indicate previous states, the number of search cycles completed, calibration status, previous corrective direction measurement values, or other information that may be used to support a search.

Table 1 details an example set of search counters that may be used to support an example linear search.

TABLE 1

Example search counters for linear search

| Counter | Description |
|---------|-------------|
| CAL | Calibration status indicator. When asserted, this search counter may prevent reset of the state counters. In some embodiments, this counter may be reset according to inactivity, expiration of a timer, or other condition warranting reset of the search counters. |
| JH | Corrective direction determined based on sample 'judgment' cycles from the sample clock signal. In some implementations, the corrective direction search counter may be a single bit, e.g., a "1" for a judgement of a high duty cycle and a "0" for a low duty cycle. In some embodiments, the state circuitry 126 may determine that an end condition is met when then counter changes value from one search cycle to the next. |
| LEAD_CLK | Indicator of the delay signal selected to serve as the leading phase signal. In some implementations, this state counter may be subsumed by operation of the 'JH' state counter. |
| LAG_CLK | Indicator of the delay signal selected to serve as the lagging phase signal. In some implementations, this state counter may be subsumed by operation of the 'JH' state counter. |
| PREV_ST | Previous state. This counter may be used by the state circuitry |

TABLE 1-continued

Example search counters for linear search

| Counter | Description |
|---------|-------------|
| | to indicate the state determined during the previous search cycle. In the linear search, the state circuitry 126 may determine the current state by incrementing this search counter. |
| BIAS_MAX | Maximum counter value for the current state. When the current state is equal to this value, the state circuitry 126 may determine that an end condition has been met. |

As used herein, resetting the search counters may include clearing the content of search counters. For example, clearing the content of the search counters may include rewriting the content to a null or default content state, or otherwise removing previously recorded values from the counters.

Referring again to block 1002 of FIG. 10, the state circuitry 126 may determine to reset search counters responsive to a search counter indicating that the state circuitry 126 is not in a calibrated state. For example, the state circuitry 126, upon completion of a search, may increment a search counter indicating a calibrated state. Responsive to a calibrated state, the state circuitry 126 may initiate a search from a current state rather than from a default initial state. Further, in some embodiments, the state circuitry 126 may apply a different search algorithm while calibrated. For example, the state circuitry 126, while in a calibrated state, may perform a centered search starting from a current state even when the same state circuitry may perform a binary search when uncalibrated.

In some embodiments, the state circuitry 126 may determine to reset the search counters based on a period of low (or no) power, inactivity, or other idle condition. For example, after a period of low power or idle operation, the voltage and temperature conditions of a system may change. In some embodiments, the change in voltage and temperature conditions may render a previous duty cycle calibration unreliable such that a new search is warranted and requested by state circuitry 126.

At block 1004, if the state circuitry 126 determines to reset the search counters, the state circuitry 126 may execute an uncalibrated search algorithm. At block 1006, the state circuitry 126 may generate a combination signal C_ID for an initial state to set relative signal strengths at the output circuitry 110 at default starting values.

At block 1008, the state circuitry 126 may cause the duty cycle correction system 100 to receive one or more cycles of an input clock signal. At block 1010, the state circuitry 126 may cause the duty cycle detection circuitry to determine the corrective direction while the duty cycle correction system 100 receives one or more cycles of the input clock signal. At block 1010, the state circuitry 126 may store the determined corrective direction within a search counter 128. Based on the determined corrective direction, a previously determined corrective direction (if recorded), and one or more previous states, the state circuitry 126 may select a current state at block 1012. At block 1014, the state circuitry 126 may generate a combination signal C_ID for the current state and send the combination signal C_ID to the output circuitry 110. At block 1016, the state circuitry 126 may record an indication of the current state within a state counter, thereby completing a search cycle. For example, for a linear search algorithm, the state circuitry 126 may increment a search counter for the current state to indicate that the search has advanced by one stage. In a binary search where the combination signal comprises an n-bit code, the state circuitry 126 may determine and record within a counter a bit of the n-bit code.

As used herein, a search cycle refers to a progression within a search algorithm from determining one current state to the determination of the next current state. Also, a current state refers to the state being determined by the state circuitry 126 in the current search cycle. Further, a previous state refers to a state determined by the state circuitry 126 in a search cycle previous to the current search cycle.

After completing the search cycle, the state circuitry 126 may determine whether an end condition has been met at block 1018. If an end condition is met, at block 1020, the state circuitry 126 may terminate the search algorithm and the output circuitry 110 may remain in the current state. If an end condition is not met, the state circuitry 126 may continue the search algorithm and return to block 1008 to begin a new search cycle.

At block 1022, if the state circuitry 126 determines not to reset the search counters, the state circuitry 126 may obtain a current state from the values within the search counters and proceed to block 1008 to begin a new search cycle.

For at least some implementations with states designated via n-bit codes, search cycles of a binary may be used to determine one bit of the code per search cycle. For example, the first search cycle may determine the most significant bit with each successive search cycle determining an additional bit until the least significant bit is determined by the state circuitry 126.

Figure 11:
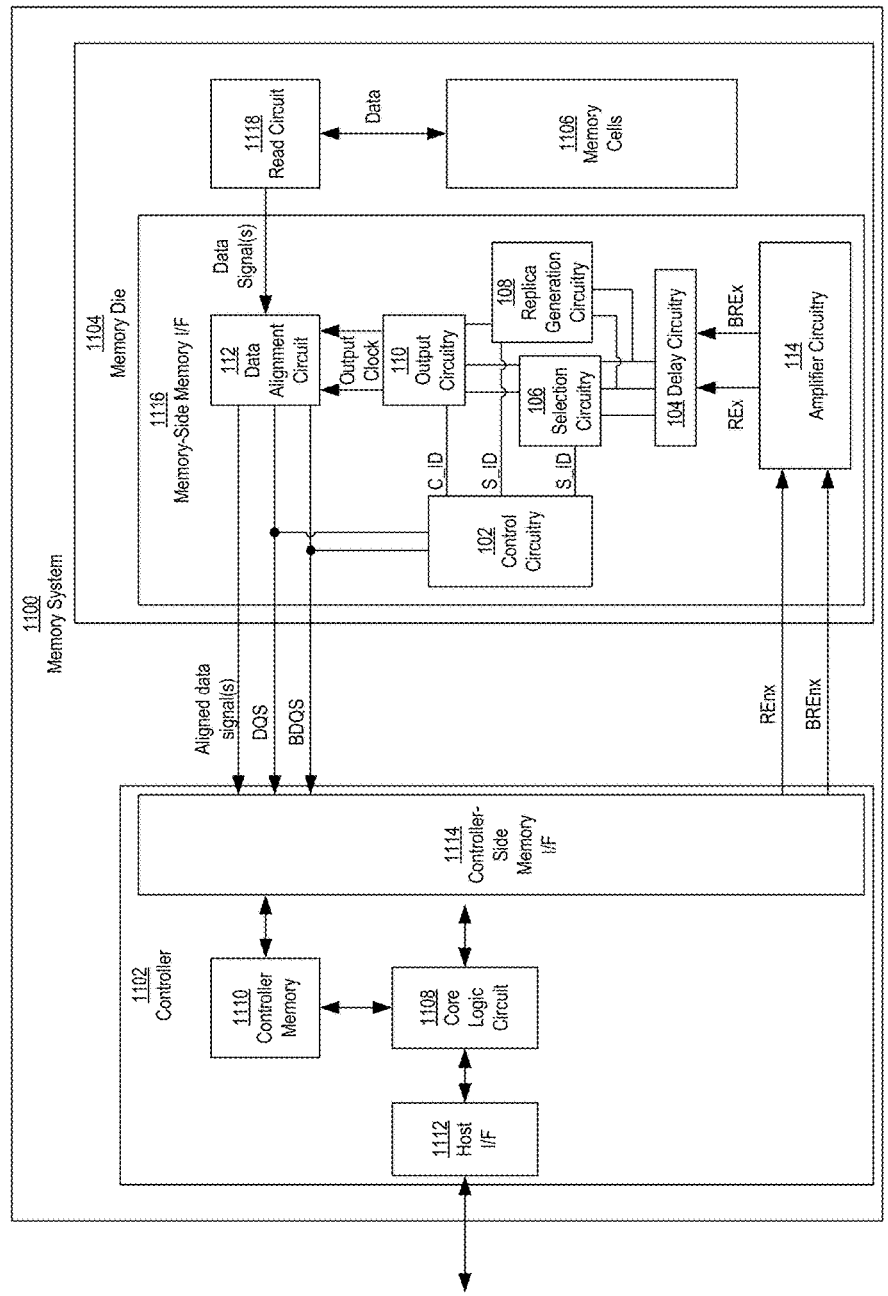
FIG. 11 shows a block diagram of an example memory system.

FIG. 11 shows a block diagram of an example memory system 1100 that may include the duty cycle correction circuit 100 as shown and described with reference to the architectures of FIGS. 1-3 and that may be configured to operate in accord with the flow diagrams of FIGS. 4, 7, and 10. The memory system 1100 may be configured to be connected to and/or in communication with a host system (not shown). The host system may be any electronic system or device that is configured to communicate and/or operate with the memory system 1100.

The memory system 1100 may include a controller 1102 and a memory die 1104. The memory die 1104 may include memory cells or elements 1106, with each memory cell or element being configured to store one or more bits of data. Any suitable type of memory cells can be used. As examples, the memory cells may be volatile memory such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory may be configured in a NAND or a NOR configuration.

The memory cells can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

The controller 1102 may include a core logic circuit 1108. The core logic circuit 1108 may be configured to perform memory management functions, non-limiting examples of which may include, but not limited to, communicating with the host system, including receiving, handling, and responding to host requests or commands, such as read, write, erase, and status requests/commands received from the host system; error detection and correction (which may be part of handling host requests/commands); formatting the memory cells 1106 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 1106); and transitioning the memory system 1100 between different states, operation modes, and/or power consumption modes. In operation, when the host system needs to read data from or write data to the memory 1106, it may communicate with the core logic circuit 1108. The core logic circuit 1108 may include hardware or a combination of hardware and software. For example, the core logic circuit 1108 may include a central processing unit, an application specific integrated circuit (ASIC), a field programmable gate array (FPGA), a digital logic circuit, an analog circuit, a combination of discrete circuits, gates, or any other type of hardware, or a combination thereof.

The controller 1102 may also include controller memory 1110, which may include volatile memory (e.g., random access memory (RAM)), non-volatile memory (e.g., read-only memory (ROM)), or a combination thereof. The controller memory 1110 may store software or firmware instructions and/or certain data structures, such as address translation data structures, that the core logic circuit 1108 may access and/or and execute to perform at least some of its memory management functions. Additionally, the core logic circuit 1108 may temporarily store data that is to be transferred to and stored in the memory cells 1106 such as in response to a host write command, and/or that was retrieved from the memory cells 1106 and is to be sent to the host system, such as in response to a host read command. FIG. 11 shows the controller memory 1110 as a component of the controller 1102, although in other example configurations, at least some of the controller memory 1110 may be a component of the memory system 1100 that is separate from the controller 1102. For example, the controller 1102 may be an integrated circuit, and depending on the configuration of the memory system 1100, the controller memory 1110 may be located on the integrated circuit, partially on the integrated circuit and partially separate from the integrated, or completely separate from the integrated circuit.

The controller 1102 may further include a host interface (I/F) 1112. The core logic circuit 1108 may be configured to communicate with a host system via a host interface 1112. In addition, the controller 1102 may include a controller-side memory interface (I/F) 1114 through which the controller 1102 is configured to communicate with the memory die 1104. Similarly, the memory die 1104 may include a memory-side memory interface (I/F) 1116 through which the memory die 1104 is configured to communicate with the controller 1102. As shown in FIG. 11, the memory-side memory interface 1116 may include the duty cycle correction circuit 100, including the control circuitry 102 and the amplifier circuitry 114 in communication with the data alignment circuit 112.

When the controller 1102 wants to read data stored in the memory cells 1106, such as in response to receipt of a host read request from the host system, a read circuit 1118 may be configured to retrieve the data from the memory cells 1106 and output the data as one or more data signals to the data alignment circuit 112. In order for the controller 1102 to know when to latch on to or sample the data pulses of the data signal(s), the controller 1102 may send a pair of complementary clock signals to the memory die 1104, and the memory die 1104 may use the pair of complementary clock signals to align the data pulses of the data signals. The memory die 1104 may then send the data aligned data signal(s) along with the complementary clock signals back to the controller 1102, and the controller 1102 look to the rising and falling edges of the complementary clock signals it receives to determine when to latch onto, sample, or otherwise identify the levels of the data pulses.

In a particular example configuration, and in accordance with the signals that are received, generated, and output in FIGS. 1-10, when the controller 1102 determines to read data from the memory cells 1106, the controller-side memory interface 1114 may output a complementary pair of clock signals REnx, BREnx to the memory-side memory interface 1116. The clock signals REnx, BREnx may be the pair of complementary pair of input clock signals received by the duty cycle correction circuit 100, as previously described with reference to FIGS. 1-10. The amplifier circuitry 114 may be configured to amplify the clock signals REnx, BREnx to generate the pair of intermediate clock signals REx/BREx. The data alignment circuit 112 may use the second pair of intermediate signals REx, BREx to align the data pulses of the data signal(s) received from the read circuit 1118, and output the aligned data signal(s) along with the pair of output clock signals DQS, BDQS back to the controller 1102.

Ideally, the data alignment circuit 112 outputs the output clock signals DQS, BDQS with a matched, predetermined duty cycle of 50%. However, in actual implementation, the data alignment circuit 112 may output the output clock signals DQS, BDQS with some amount of duty cycle distortion. In general, the duty cycle of one of the output clock signals DQS, BDQS is higher than the other. Having too much duty cycle distortion in the output clock signals DQS, BDQS may lead to too many errors when the controller 1102 is receiving the data signals. For example, too high of duty cycle distortion may cause the data pulses of the data signal(s) to not be sufficiently aligned with the pulses of the output clock signals DQS, BDQS, which in turn may cause the controller 1102 to sample the level of the same data pulse twice and/or to miss sampling a data pulse. In addition or alternatively, if a clock pulse of the output clock signals DQS, BDQS is too small, sampling circuitry of the controller 1102 may filter out or otherwise not recognize a falling or rising edge of the output clock signals DQS, BDQS, and in turn miss sampling a data pulse.

Two sources may be the cause of the duty cycle distortion in the output clock signals DQS, BDQS. First, the controller 1102 may generate and output the initial pair of complementary clock signals REnx, BREnx with distorted duty cycles. Second, the clock path extending from the input of the amplifier circuitry 114 to the output of the data alignment circuit 112 may distort the duty cycles. Either or both of these sources may cause the data alignment circuit 112 to output the output signals DQS, BDQS with too high of an amount of duty cycle distortion if duty cycle correction is not performed.

As shown in FIG. 11, the control circuitry 102 of the duty cycle correction circuit 100 may be coupled to the lines on which the data alignment circuit 112 outputs the output clock signals DQS, BDQS, as shown in FIG. 11, or to another point within the memory die to obtain the sample clock signal. As previously described, the control circuitry 102 may be configured to search for and/or select a state defining relative signal strength for the signals being combined at the output circuitry 110. The signal strengths may be implemented by applying bias signals to the gates of the bias transistors 312, 322 of the output circuitry. The output circuitry may control the relative signal strengths to control the delay of a particular transition of the output clock signal to adjust the duty cycle of the output clock signal. As previously described, the duty cycles of the sample clock signal can be or, at least moved closer to, the predetermined duty cycle of 50%, which in turn may lead to higher signal integrity and a reduced amount of errors when the controller 1102 and the memory die 1104 communicate to read data from the memory cells 1106. Reduced errors may lead to increased system efficiency. Accordingly, the techniques and architectures supporting interpolation, delay signal selection, corrective direction determination, and other disclosed features may increase the performance of memory hardware. This may be of particular benefit as the speed or data rate requirements for which the controller 1102 and the memory die 1104 communicate increases, such as into the Gigahertz range, because higher frequencies may cause larger amounts of duty cycle distortion.

A successful duty cycle correction process may be able to bring the amount of duty cycle distortion to within an acceptable amount of duty cycle distortion or mismatch. Interpolation based duty cycle correction may allow for accurate duty cycle correction in a wide variety of duty cycle correction scenarios. For example, interpolation may correct relatively large duty cycle distortion by moving multiple pre-defined bias voltage levels away from a current bias voltage levels. Further, the interpolation may correct relatively small duty cycle distortion by moving fewer pre-defined bias voltage levels away from the current bias voltage levels.

It is intended that the foregoing detailed description be understood as a non-limiting illustration of selected forms. Other forms are possible. It is only the claims, including all equivalents, that are intended to define the claimed invention. Finally, it should be noted that any aspect of any of the implementations described herein can be used alone or in combination with one another.

What is claimed:

1. A circuit comprising:
control circuitry configured to determine a corrective direction to change a duty cycle of a sample clock signal to correct for a duty cycle error of the sample clock signal;
delay circuitry configured to delay an input clock signal to generate a plurality of relative delay signals comprising different phases relative to each other;
selection circuitry configured to select a leading phase signal and a lagging phase signal from among the plurality of relative delay signals according to the corrective direction; and
output circuitry configured to generate an output clock signal in response to a combination of the leading phase signal and the lagging phase signal, the output clock signal comprising a duty cycle corresponding to the corrective direction.

2. The circuit of claim 1, where the plurality of relative phase signals comprise:
an early signal;
a mid signal delayed with respect to the early signal; and
a late signal delayed with respect to both the early and mid signals.

3. The circuit of claim 2, where the selection circuitry is configured to:
when the corrective direction corresponds to reducing the duty cycle, select the early signal as the leading phase signal and the mid signal as the lagging phase signal; and
when the corrective direction corresponds to increasing the duty cycle, select the mid signal as the leading phase signal and the late signal as the lagging phase signal.

4. The circuit of claim 1, where the delay circuitry comprises a plurality of delay signal outputs configured to generate the plurality of relative phase signals, the plurality of delay signal outputs separated from one another by a plurality of discrete delay stages.

5. The circuit of claim 4, where the discrete delay stages comprise inverter pairs individually configured to maintain polarity of the input clock signal after imparting delay.

6. The circuit of claim 1, where the selection circuitry comprises:
a digital-to-analog converter configured to receive selection code from the control circuitry and generate a control output;
a leading multiplexer configured to:
receive the control output; and
select the leading phase signal from among the plurality of relative phase signals; and
a lagging multiplexer configured to:

receive the control output; and
select the lagging phase signal from among the plurality of relative phase signals.

7. The circuit of claim 1, where:
the sample clock signal comprises a complementary pair of clock signals; and
the control circuitry is configured to determine which of the complementary pair of clock signals has a higher duty cycle.

8. The circuit of claim 7 where the control circuitry comprises a low pass filter configured to:
receive a plurality of cycles of the sample clock signal;
generate a higher level voltage output responsive to the one of the complementary pair of clock signals with a higher duty cycle; and
generate a lower level voltage output responsive to the one of the complementary pair of clock signals with a lower duty cycle.

9. The circuit of claim 1, where the output circuitry is configured to:
fix rising transitions of the output clock signal to falling transitions of the leading phase signal; and
interpolate between rising transitions of the leading and lagging phase signals to generate falling transitions of the output clock signal.

10. A circuit comprising:
delay circuitry configured to, based on an input clock signal, generate a leading phase signal and a lagging phase signal;
replica generation circuitry configured to, based on the input clock signal, generate a replica clock signal; and
output circuitry configured to:
select among a plurality of relative signal strengths for the leading phase signal and the lagging phase signal; and
in response to the replica clock signal, drive combination of the leading phase signal and the lagging phase signal for rising transitions or for falling transitions of the input clock signal.

11. The circuit of claim 10, where the output circuitry comprises a drive transistor configured to, when the replica clock signal is at a high level, pull up a signal output of the output circuitry to a supply voltage level.

12. The circuit of claim 10, where the output circuitry is configured to:
steer current along a leading branch of the output circuitry in accord with the leading phase signal; and
steer current along a lagging branch of the output circuitry in accord with the lagging phase signal.

13. The circuit of claim 12, where:
the leading branch comprises a leading bias transistor configured to control a first relative signal strength of the plurality of relative signal strengths in accord with a leading bias voltage; and
the lagging branch comprises a lagging bias transistor configured to control a first relative signal strength of the plurality of relative signal strengths in accord with a lagging bias voltage.

14. The circuit of claim 13, where the output circuitry comprises:
a leading digital-to-analog converter configured to:
receive a combination code from control circuitry; and
responsive to the combination code generate the leading bias voltage; and
a lagging digital-to-analog converter configured to:
receive the combination code from control circuitry; and
responsive to the combination code generate the lagging bias voltage.

15. The circuit of claim 14, where the leading digital-to-analog converter is configured to reduce the leading bias voltage when the lagging bias voltage is increased to maintain a constant output amplitude of an output clock signal of the output circuitry.

16. The circuit of claim 13, where:
the leading bias transistor and the lagging bias transistor comprise n-channel metal oxide semiconductor transistors; and
the output circuitry is configured to, responsive to the replica clock signal, drive combination of the leading phase signal and the lagging phase signal for falling transitions of the input clock signal.

17. The circuit of claim 12, where:
the leading branch comprises a leading signal transistor configured to receive the leading phase signal; and
the lagging branch comprises a lagging signal transistor configured to:
receive the lagging phase signal; and
in combination with the leading signal transistor, pull down a signal output of the output circuitry to a reference voltage level to generate a falling transition for an output clock signal.

18. The circuit of claim 10, where the replica generation circuitry comprises a multiplexer configured to copy the leading phase signal to generate the replica clock signal.

19. A system comprising:
duty cycle detection circuitry configured to:
detect a duty cycle error for a sample clock signal;
based on the duty cycle error, determine a corrective direction for a duty cycle of the sample clock signal; and
responsive to the corrective direction, output a selection signal;
state circuitry configured to:
determine a current state of a search algorithm; and
based on the current state, generate a combination signal;
delay circuitry configured to:
generate a plurality of delay signals based on an input clock signal, the plurality of delay signals comprising different delays from each other relative to the input clock signal;
replica generation circuitry configured to:
generate a replica clock signal based on a first one of the plurality of delay signals;
multiplexer circuitry configured to output a pair of delay signals from among the plurality of delay signals responsive to the selection signal;
output circuitry comprising:
driving circuitry configured to, responsive to the replica clock signal, drive the output circuitry during a specific signal transition for each of a plurality of cycles of the first one of the plurality of delay signals; and
steering circuitry configured to:
receive the pair of delayed signals from the multiplexer circuitry;
responsive to the combination signal, select a pair of relative signal strengths from among a plurality of predefined signal strengths for the pair of delayed signals;
responsive to the pair of delayed signals, steer current through a plurality of branches in accord with the pair of relative signal strengths; and generate an output clock signal comprising a duty cycle corresponding to the corrective direction and the steered current.

20. The system of claim 19, where the state circuitry is further configured to:
   access a state counter to determine a previous state determined during a previous search cycle of the search algorithm;
   determine the current state responsive to the corrective direction and the previous state; and
   update the state counter to reflect the current state.

\* \* \* \* \*